(12) United States Patent
Silverman

(10) Patent No.: US 7,774,969 B1
(45) Date of Patent: Aug. 17, 2010

(54) CARRIER FOR SECURING A PORTABLE DIGITAL INFORMATION DEVICE ON AN IDENTIFICATION BADGE OR IDENTIFICATION BADGE HOLDER OR INFORMATION ARTICLE

(76) Inventor: Lee O. Silverman, 24 Clear Spring Dr., Morgantown, WV (US) 26508

( * ) Notice: Subject to any disclaimer, the term of this patent is extended or adjusted under 35 U.S.C. 154(b) by 934 days.

(21) Appl. No.: 11/603,493

(22) Filed: Nov. 22, 2006

Related U.S. Application Data

(60) Provisional application No. 60/761,620, filed on Jan. 24, 2006, provisional application No. 60/751,796, filed on Dec. 20, 2005.

(51) Int. Cl.
*G09F 3/18* (2006.01)
(52) U.S. Cl. .................. 40/661; 40/586; 40/654.01; 40/1.5; 224/257; 224/600; 224/623
(58) Field of Classification Search ............... 40/661, 40/586, 654.01, 1.5; 224/610, 257, 600, 224/623
See application file for complete search history.

(56) References Cited

U.S. PATENT DOCUMENTS

| | | | |
|---|---|---|---|
| 4,937,963 A | 7/1990 | Barnes | |
| 5,986,562 A * | 11/1999 | Nikolich | 340/693.5 |
| 6,041,921 A * | 3/2000 | Staiano et al. | 206/236 |
| 6,085,393 A | 7/2000 | Tsui et al. | |
| D494,632 S * | 8/2004 | Gladstone | D20/43 |
| 6,848,207 B1 * | 2/2005 | Powell | 40/661 |
| 7,336,185 B2 * | 2/2008 | Turner et al. | 340/572.8 |
| 7,575,137 B1 * | 8/2009 | Lederer et al. | 224/601 |
| 2002/0099894 A1 * | 7/2002 | Kehoe et al. | 710/300 |
| 2002/0153400 A1 | 10/2002 | Chase et al. | |
| 2005/0246929 A1 * | 11/2005 | Chu | 40/586 |
| 2006/0001541 A1 * | 1/2006 | Leyden et al. | 340/568.2 |
| 2006/0150457 A1 * | 7/2006 | O'Boyle | 40/658 |
| 2008/0014867 A1 * | 1/2008 | Finn | 455/41.1 |

* cited by examiner

*Primary Examiner*—Gary C Hoge
(74) *Attorney, Agent, or Firm*—Eckert Seamans Cherin & Mellott, LLC; Arnold B. Silverman, Esq.

(57) ABSTRACT

An identification badge holder includes a portable digital information device, which may be a USB flash drive secured directly or indirectly to the rear face thereof by any of a number of structures which would facilitate ready access, secure attachment and, in some instances, redundant securement employing two types of securement. A system for attaching a stand-alone identification badge to a card which has a USB flash drive secured or securable thereto.

18 Claims, 25 Drawing Sheets

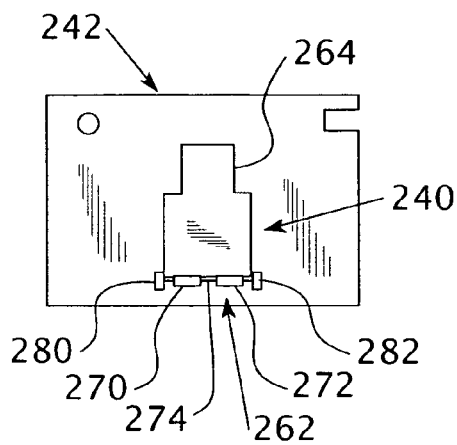
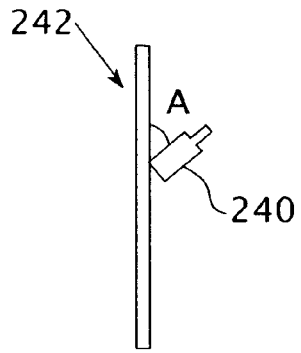
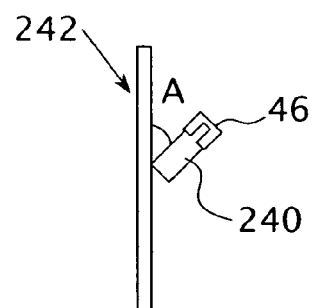
FIG. 21    FIG. 22    FIG. 23
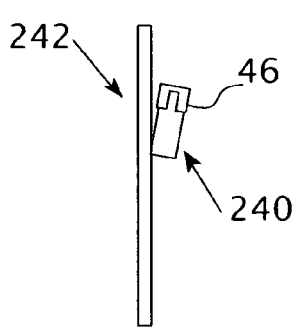
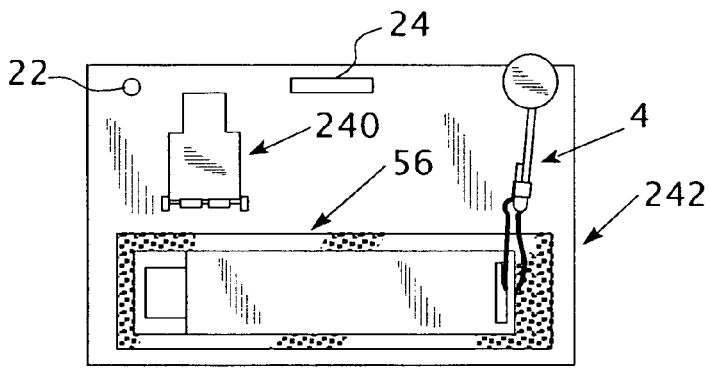
FIG. 24    FIG. 20
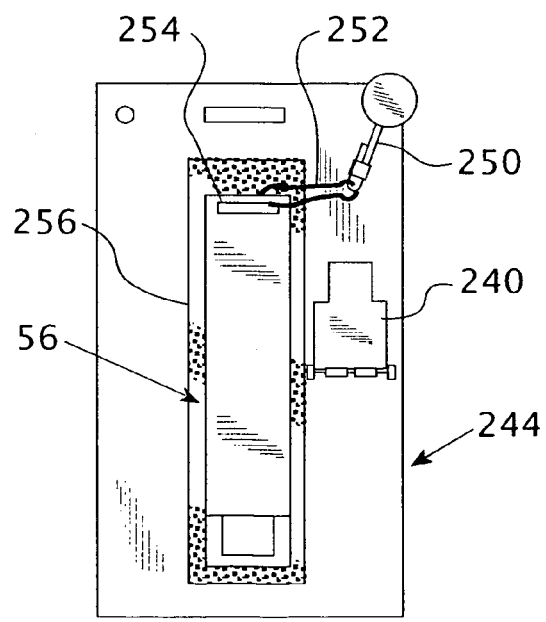
FIG. 25

CARRIER FOR SECURING A PORTABLE DIGITAL INFORMATION DEVICE ON AN IDENTIFICATION BADGE OR IDENTIFICATION BADGE HOLDER OR INFORMATION ARTICLE

CROSS-REFERENCE TO RELATED APPLICATIONS

This application claims the benefit of U.S. Ser. No. 60/751,796, filed Dec. 20, 2005, and U.S. Ser. No. 60/761,620, filed Jan. 24, 2006, the disclosures of which are incorporated herein by reference.

BACKGROUND OF THE INVENTION

1. Field of the Invention

The present invention relates to a number of embodiments of structures which facilitate attachment of a USB flash drive to an identification badge or identification badge holder, directly or indirectly, such that the USB flash drive is safely and securely retained with or without redundant securing structures and yet can be readily accessed, easily removed and, after use, stored.

2. Description of the Prior Art

The use of devices such as Universal Serial Bus (USB) flash drives has become a common way for an individual to store, transport, and keep one's information with them. Due to their small physical size and large capacity to hold information, they can be a tremendous asset. Previously, one might have had to carry large quantities of paper documents and larger sized physical media formats for audio, video, or any other type of media they may have needed access to professionally or for recreation. This potentially consumed significant amounts of space and would require carrying these items in hand, in pockets or in some sort of briefcase, container or bag.

The standardization of a large capacity, small form factor electronic digital storage media has allowed people to keep their information with them so that it is easy to transport and may be accessed readily virtually anywhere. The ability to keep devices such as this safe, secure and readily accessible is highly desirable. The present invention provides improvements over existing methods and more efficient ways to accomplish this goal while keeping the devices close at hand.

Portable digital information access/storage devices are made by many manufacturers and come in a variety of shapes and sizes. They often are equipped with some form of attachment means to attach them to a lanyard or keychain for carrying. While these methods offer some level of security to the device and a way to locate the device with minimal searching, they are somewhat impractical in many situations:

Attaching the device to a standard keychain may require one to leave one's keys attached to it while is it connected to and hanging from an information system when the device is engaged. This can prove to be less than desirable as it can put undo stress on the device itself and the electronic port-surrounding circuitry of the information system due to the potential excess weight of the other items on the keychain and a downward pulling motion caused by them. This weight may exceed the manufacturer's designed tolerance limits and cause failure to the device or the information system. Also, electronic files on devices such as USB flash drives require care so that they are not likely to become corrupted. Once the device is in use through a connection to an information system, time is required to close files that are open and being accessed and also allowing data/reads and writes to complete before safely removing the product from the USB port. Should someone need a key from the same keychain and the device is on to quickly gain access to something, they may either need to wait to close all files being worked with before gaining access to the needed key, or they may in haste remove the device prematurely and unknowingly cause damage to their data. Having to remove the device from the computer while still needing to work on documents contained by it at that time may also cause loss of productivity in having to close things and later reopen them to continue working later. Due to the serrated edges that cut keys have, keys hanging off the side of the computer system may damage its finish in much the same way car keys hanging can cause damage to a car door while one key is inserted to unlock the car. In having the device coexist with keys having sharp edges, it may also show excessive external wear and finish damage due to having them rub against it continually, thereby damaging the device physically.

Even though there is an inherent sense of responsibility associated with carrying keys, the fact remains that key chains can be lost. Having this device on a keychain can result in the device being lost at the same time. Unlike losing a key to something where the real value is generally in the thing the key goes to, in the instance of losing this device, the real value is in the data that it contains and a much more severe loss can be experienced. Stored on a device such as this could be the only copy of a document or electronic file. This could be the result of tremendous periods of time invested in work to produce the document or file. Unlike simply calling a locksmith, one could be faced with needing to reinvest the same efforts it required to create them hoping to restore the work to the previous level of completeness. Many are not aware of the fact that having only one copy of an important work gives a single point of failure. When backup practices are not employed regularly and a loss occurs, the results can be devastating.

If one wears this device on a traditional lanyard, the device is kept out in the open on ones person and this may not be desirable for a number of reasons. Beyond the value of the physical device itself, the information contained on the device may be valuable or sensitive in nature. Having the device in plain sight may encourage a thief to attempt to steal it by yanking it off the lanyard. Also, existing methods of attaching the device to a lanyard employ only a single latching or holding mechanism. This can become a single point of failure. Should the device not have been latched properly to the lanyard, or should an unanticipated action cause the latching mechanism to come apart, the device could drop to the ground and not be noticed as missing at the time. This could result in physical damage or could cause the device and its contents to be permanently lost. Additionally, in the case of confidential information being carried on the device, it could potentially fall into the hands of individuals that should not have access to it or knowledge of the information.

Some organizations require employees to wear items tethered to lanyards from their necks such as identification badges. Having to wear an additional lanyard around one's neck to support this device may increase the chances of susceptibility to physical harm to the individual wearing them. Should the individual manage to get the lanyards hanging from their neck caught on something, the chances for choking or other physical injury may be increased due to the strength added by this secondary rope-like layer around their neck.

In professional environments where identification badges must be worn, having an additional item to wear may appear to be unsightly and sloppy as there is often a focus towards fashion equating to professionalism. Something additional visibly hanging from one's body on clothing may prove to be undesirable as it detracts from one's clothing and professional appearance.

Due to the trend towards increased levels of security in many work environments and organizations, identification badges have become commonly worn on one's person and are generally displayed prominently for visual identification. Identification badges often consist of a plastic card that on one side has printed information such as a picture, name and organizational information. The reverse side can contain magnetic data strips or other forms of embedded electronics for allowing access through security systems. These cards are often carried in a holder which either clips to one's clothing or is worn hanging from a lanyard.

Identification badges and identification badge holders are often attached to one's person by the following ways, for example, (a) lanyard fitting around one's neck or (b) an ID strap clip consisting of a piece of vinyl material with snaps that can form a loop to insert into a receiving slot in a badge holder or in some cases a slot cut directly into the ID badge itself or (c) by way of a retractable apparatus that can allow for pulling the identification badge or holder away from one's person for temporary use and then allows for direct retraction of the badge or holder towards the base point from which it was moved. This method uses some sort of string inside an encasement that attaches to one's clothing generally by way of a spring load clip.

Common rigid ID badge holders offer a structure through which the identification card may slide in and out. They generally consist of three bordering, closed sides and have one open side. While the card is in a stored or display position, the holder securely holds its edges while displaying one's visually accessible information for others to review. When the card is needed to be removed temporarily for reasons such as swiping into a card reader or moving into a proximity field where it might be examined for needed information, it may simply slide out through the open side of the holder and then be reinserted through the same passageway.

Devices normally requiring a lanyard or case of their own can be integrated into the available space of a structure designed to carry an identification badge. This reduces the number of steps one has to take in order to secure or remove what they are carrying. It also conceals the device while keeping it readily available and physically secure.

Often the information contained on a device such as this has a value much greater than the device itself. The ability to keep this small electronic device that can hold a tremendous amount of information physically secure is, therefore, important.

Having ready and rapid physical access to one's information makes the functionality of the device even more of an asset. Other methods of carrying a portable electronic storage device may take longer to get from a dormant or stored state to an in-use state due to the time it takes locate it, make it usable and insert it into an information systems port.

A commonly perceived deficiency that many portable digital information access/storage devices have is that while end caps are often used to protect the device while not in use, a place to keep the end caps while the device is in use is often not included in most designs or may not be well implemented. In some designs, the end cap may not fit tightly to the back of the device as would the cap from a ball point pen, for example, when removed from the front and moved to the rear for storage while the pen is in use. In these cases, the device cap could fall off, be lost or be crushed on the floor as one accidentally steps on the cap. In other cases, the place an end cap would go is also where the device may connect to an optional carrying apparatus such as a lanyard or keychain. When the carrying apparatus option is used, as it commonly is, it interferes with where the end cap would be stored making it difficult to keep in that location while the device is in use. Other designs make no effort to incorporate a temporary storage place for the end cap. In these cases, end caps are often left separately from the device and placed somewhere nearby such as on a desktop. It is easy to forget them when leaving an area when a session with a device is concluded. Some individuals will place the cap in a clothing pocket where it may be forgotten and run through a laundry cycle where it could be damaged or melted due to heat or possibly ruin clothing. Also, in the case of placing an end cap into one's pocket, it may take longer to remove it when it is desired or may even rest itself uncomfortably against the body causing irritation. Often users will elect to not use the end cap at all which renders the device less protected from the elements. Some of the embodiments described in the present invention offer a practical and secure place to store end caps while the device is in use and the end caps are removed from the device. None of the embodiments require that an end cap be used or be present as some individuals chose to not use them at all. Leaving the end cap off saves them time and allows users to employ the portable digital information access/storage device more quickly without having to take it off and replace it, although the user gives up some level of protection for the device in doing so.

U.S. Pat. No. 6,085,393 discloses a badge strap attachment structure which facilitates attaching a badge to clothing.

U.S. Pat. No. 6,848,207 discloses an identification badge assembly adapted to be worn around the neck of the user and structured to have products, such as pharmaceuticals attached thereto, as well as providing a support for eyeglasses.

Published United States Patent Application US2002/0153400 discloses a carrying case structured to be worn around the neck and having a window for insertion of an ID badge and a rear pouch for insertion of a personal assistant device.

Despite these known constructions, there remains a very real and substantial need for a carrier for securing a USB flash drive to an identification badge holder or identification badge.

SUMMARY OF THE INVENTION

The present invention provides a number of embodiments for securing a USB flash drive to an identification badge holder or identification badge removably and returnably in a secure manner. In one embodiment, securement is achieved through hook-and-loop fasteners, such as those offered under the trademark Velcro. In another embodiment, it is secured by a tether which may have a snap fit connection to the rear face of the badge or badge holder. Other forms of retention structures are disclosed. In some embodiments, redundant securement is provided such that if one form of securement becomes disconnected accidentally, the other form resists loss of or damage of the USB flash drive.

The apparatus in various embodiments is structured to be employed with normally vertically oriented as well as normally horizontally oriented badge holders and badges.

In one embodiment, securement of the end cap when the USB flash drive is in use is provided, such as by securing the end cap to the rear face of the badge or badge holder.

In other embodiments, rather than securing the USB flash drive directly to a rear face of the badge or badge holder, a protective structure such as a slidable or rotatable drawer may be employed. In another embodiment, a sleeve composed of an elastic material structured to hold the USB flash drive in intimate contact with the rear face of a badge holder or badge is provided. The invention also provides for modified holders in securement of the USB flash drive to the rear surface of the ID badge or badge holder so as to facilitate ready access, such as for a reader, to a magnetic strip which forms part of the ID badge.

It is an object of the present invention to provide an economical and effective structure for attaching a USB flash drive to a badge holder or badge in a secure, relatively non-visible location.

It is another object of the present invention to provide such an assembly for stand-alone ID badges.

It is a further object of the present invention to provide such an assembly wherein the USB flash drive is not only protectively secured in a readily accessible manner, but also can be restored easily to its storage position after use.

It is a further object of the present invention to permit securement of the USB flash drive to an ID badge holder or ID badge simultaneously by more than one attachment structure, such that if one fails or is accidentally released, the other will secure the same against damage.

It is a further object of the present invention to provide for independent securement of the USB flash drive cap when the flash drive is in use.

It is a further object of the present invention to provide such a product which will provide effective securement of the USB flash drive to a rear surface of a badge or badge holder so as to resist undesired physical contact with other objects, while preserving ready access thereto.

These and other objects of the invention will be more fully understood from the following description of the invention on reference to the illustrations appended hereto.

BRIEF DESCRIPTION OF THE DRAWINGS

FIG. 20 is a rear elevational view of another embodiment of the invention showing an end cap holder secured to the identification badge holder.

FIG. 21 is a fragmentary detailed enlargement of the upper left quarter of FIG. 20.

FIG. 22 shows a left-side elevation of a portion of FIG. 20 with a cap holder extended.

FIG. 23 shows a similar view to FIG. 22 with a cap in place.

FIG. 24 shows a similar view to FIG. 23 with the holder retracted.

FIG. 25 shows a rear elevation of a vertically oriented embodiment of the invention similar to the horizontal version shown in FIGS. 20 through 24.

DESCRIPTION OF THE PREFERRED EMBODIMENTS

Figure 1:
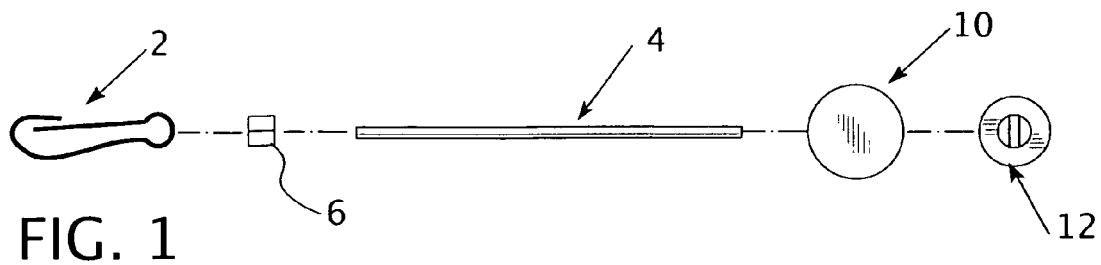
FIG. 1 is an exploded view of a form of tether for securing an identification badge holder of the present invention.

As employed herein, the term a "portable digital information access/storage device" or "portable digital information device or "device" or "USB flash drive" means a physically small electronic device capable of storing, creating, or making digital information available and shall expressly include, but not be limited to, the preferred flash memory drives, jump drives, thumb drives, pocket drives and devices having similar capabilities. Their electronic capacity may be measured in terms of computer memory sizes such as Megabytes, Gigabytes, and Terabytes. These are designed to be electronically written to and read from, recorded to or played from, and, in general, contain and grant access to one's "information". In some cases, the device may contain circuitry to allow access to the electronic information as a stand-alone, and, in other cases, it may require connecting it to an "information system" equipped to access the device. It could be a device to contain and play electronic media files as well as connect to an information system, when desired, or could be a device that simply carries information that would require connection to an information system for access to the information, for example. These terms shall also include, but not be limited to, other standardized physical formats of storage media and digital music, video, and still picture capturing and playback devices such as MP3 players.

As employed herein, "information" means any digital object, such as, but not limited to: documents, pictures, graphics, photographs, music, videos, presentations, applications or any other form of computer software or data file.

As employed herein, an "information system" is an electronic or computerized system that allows interfacing with a portable digital information access/storage device through physical, wireless or proximity based connection. This term shall include, but not be limited to, a personal computer with standardized physical or logical ports designed to accept and exchange information with a portable digital information access/storage.

As employed herein, an "identification badge" or "ID badge" means an article used to make one's identity, code, credentials or other information known to humans, security systems, access systems or information systems. This term shall include, but not be limited to, standard sized plastic cards that may have printed information such as graphics and text that can be oriented to be read in vertical, horizontal or other positions. These cards may also contain bar codes for scanning, magnetic stripes for swipe readers, RFID chips or printed circuits and proximity detection circuitry for proximity card type readers. These cards may sometimes have slots directly punched in them to enable their being attached to humans by accessory clips, lanyards and retractable reels, or sometimes they may be inserted into other carrying apparatus.

As employed herein, an "identification badge holder" means a type of device used to hold, protect or make an identification badge readily available for visual inspection and/or to allow the badge to be temporarily removed or moved towards an electronic system designed to interact with it. This term shall include, but not be limited to, rigid ID badge holders, as well as other types of badge holders with varying thickness and degrees of flexibility that may be made of materials such as plastic, vinyl, lexan, Plexiglas, metal or fabric. These are generally made in vertical or horizontal orientations to match the intended orientation of the identification badge to allow for easy visual analysis.

As employed herein, "information article" means (a) an ID badge or (b) an ID badge holder or (c) a card or card-like article for removably securing a USB flash drive and structured to be secured in close adjacency to an ID badge.

As employed herein, "port(s)" means a type of interface to an information system that allows connectivity and data exchange with a portable digital information access/storage device. These can be industry-standard physical interfaces such as Universal Serial Bus (USB), fire wire or any other standardized interface that the portable digital information access/storage device might connect to. In addition to physical connections, these can also be described as being through any type of nonphysical connections such as Infrared, Wireless Fidelity (Wi-Fi), Bluetooth, cellular, satellite or any other connection medium that does not require a physical connection to the device.

As employed herein, an "ID strap clip" means a structure that allows for attaching an identification badge or identification badge holder to one's clothing, a lanyard or virtually anything one might have on their person or carry that they wish to attach identification to. ID strap clips have a spring-loaded alligator-type clip on one end for attaching itself to the desired article on the carrier, and the other end has a vinyl strap with snaps that forms a loop which can be used to insert through industry-standard slots in ID badges or ID badge holders allowing them to be secured to the structure and whatever it is to be attached to. Some types of lanyards also have an alligator-type clip that attached directly to the badge or badge holder slot without having to loop through it.

As employed herein, the term "fastener strips" means a pair of structures each having a plurality of irregularities formed or secured in one such structure which is structured to interengage the irregularities of the other to establish a first position with secure attachment to the other while permitting ready separation of the same from the other non-destructively. It shall expressly include, but not be limited to, (a) a pair of strips having hook-and-loop—type fasteners, such as those marketed under the trade designation Velcro, and (b) a pair of strips (herein "projection fasteners"), having a plurality of projections with enlarged sections such as mushroom-shaped projections provided on the locking strips, such as, for example, those marketed by 3M under the trade designation Dual Lock as disclosed in the 3M Technical Data Sheet dated August, 2000, entitled "3M Dual Lock Reclosable Fasteners". In general, the strips will preferably have an array of projections which may be in a plurality of rows and columns and will, depending on the size of the USB flash drive and the specific embodiment of the invention, preferably have about 100 to 400 projections or nubs per linear inch of strip. The projections are preferably resilient. The projections may, if desired, be substantially identical on both strips as compared with the opposite gender strips in hook-and-loop fasteners, such as Velcro fasteners.

The invention described in the embodiments set forth herein facilitates (a) physically secure transport of a portable digital information access/storage device, (b) rapid access to the portable information storage device being carried and (c) an unobtrusive way to carry the device that conceals it by attaching it to an article one would likely already be carrying.

One way this invention may be implemented is by providing a structure to the back of an ID badge holder or ID badge as to allow for a standardized approach to accommodate most shapes and sizes of a device.

In cases where the identification badge itself has a slot, as opposed to a non-slotted one that would need to be carried in badge holder, the badge may be attached to the person by way of any of a number of ways known to those skilled in the art. In these cases, a separate device-carrying apparatus that can be physically positioned behind the ID badge itself, while allowing for holding the device in place and keeping it concealed and physically secured, may be employed. These types of ID badges often use an ID strap clip which can have a loop large enough to allow the device-carrying apparatus to also be carried in the loop with the ID badge. The loop should be large enough to give ample room to rotate a magnetic stripe ID card away from the information storage device holder so that the ID card may be swiped without having to detach anything from the carrying assembly provided by the ID strap clip. With respect to ID cards that have a slot in them, the embodiments described for ID badge holders herein could be utilized by mounting them to the back of a slot second card surface that would be carried behind the slot in the ID card by the same ID strap clip or similar carrying apparatus.

One way that this invention could be made available is to be an after-market item to be purchased as an accessory allowing existing ID badge holders and ID badges and portable digital information access/storage devices to be carried together. The descriptions found in the embodiments of this invention may be considered as either additions to existing identification badge holders or identification badge holders can also be constructed to include the enhancement features described herein.

Unless specifically specified to the contrary, it is assumed that a variety of materials may be used to construct the items shown. These include, but are not limited to: plastic, nylon, Kevlar, Velcro, titanium, steel, aluminum, vinyl, neoprene, a resinous plastic, composite materials or any combinations thereof.

For clarity of disclosure herein, examples of four types of identification card types and orientations will be considered. They are: (a) horizontally oriented ID badge carried in horizontally oriented ID badge holder, (b) horizontally oriented ID badge that has been slot punched permitting free standing use, (c) vertically oriented ID badge carried in vertically oriented holder and (d) vertically oriented ID badge that has been slot punched.

For convenience of disclosure herein, examples will focus on an ID badge holder; however, it will be appreciated that the same retention structures can be employed on a free-standing ID badge or to a card secured to or positioned in close proximity to an ID badge holder or ID badge.

Numerous embodiments in this invention utilize a "tethering device" to aid in securing the portable digital information access/storage device to ID badge or ID badge holder. This is something that the end user can attach and it can remain connected to the portable digital information access/storage while in transit and while in use. Tethering device makeup and features are shown in FIGS. 1 through 5 and are described as follows:

An exploded view of the tethering device is shown in FIG. 1. It includes a snap button (which may have standard clothing-type snap cap assembly having socket to connect to post attached to ID badge holder):

Lanyard hook 2 is to be connected to a piece of cord 4 that can be fabric, leather, metal, vinyl, plastic, metal based, or any combination of aforementioned materials by way of a loop placed in fabric and compression fitting 6 that is crimped around the cord 4. A snap cap-type socket 10 is attached to the cord 4. A snap cap socket 10 attaches to the back of the snap post 12 and the cord 4 is secured between the two. A large snap cap socket 10 may be desirable to use as it is easy to grip and orient ones hand to without needing to look at it. Large snap button assemblies are not required as virtually any size will function. The cord 4 in the tethering device is made of strong material as it may be pulled on to remove the portable digital information access/storage device from its mounting apparatus.

Figure 2:
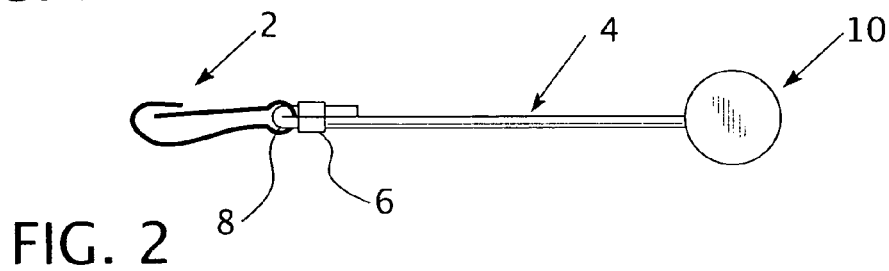
FIG. 2 is a top plan view of the assembled tether of FIG. 1.

FIG. 2 shows a front elevation of the fully assembled lanyard hook-ended tethering device comprised of these components: lanyard hook 2, cord loop 8, compression fitting 6, which creates loop 8 in cord 4, and snap cap elements 10, 12.

Figure 3:
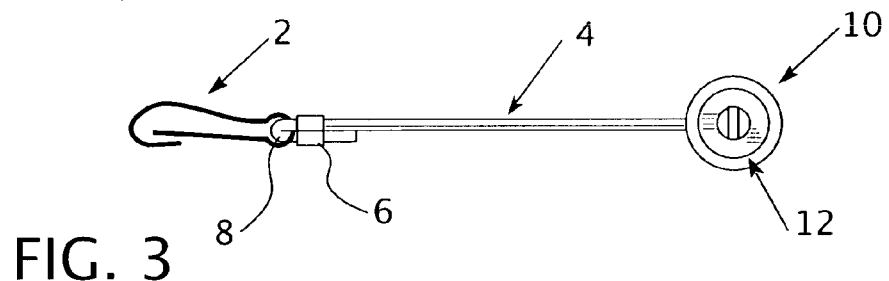
FIG. 3 is a bottom plan view of the assembled tether of FIG. 1.

FIG. 3 shows a rear elevation of the fully assembled lanyard hook-ended tethering device having lanyard hook 2, cord loop 8, compression fitting 6 and snap cap elements 10, 12.

Figure 4:
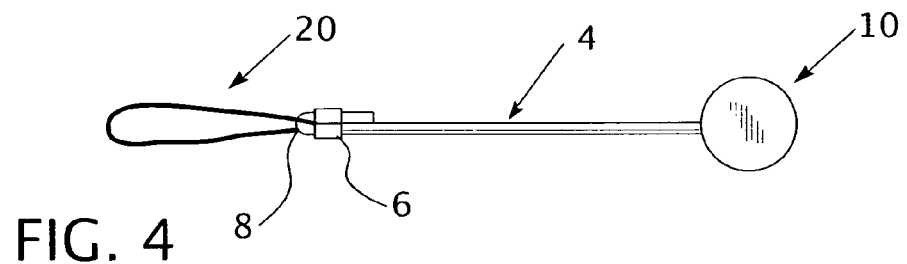
FIG. 4 is a top plan view of a modified form of tether having a closed loop end rather than a clip, such as in FIGS. 1-3.
Figure 5:
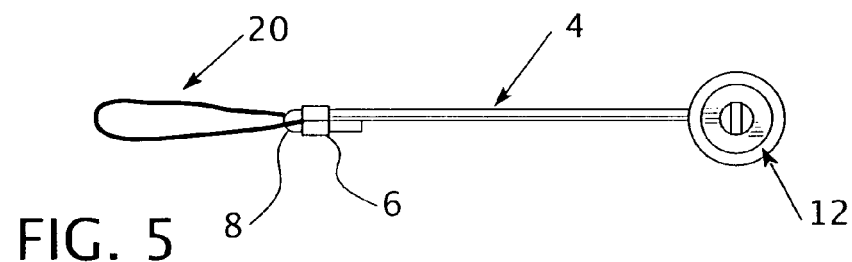
FIG. 5 is a bottom plan view of the tether of FIG. 4.

FIGS. 4 and 5 show, respectively, a top plan view and a bottom plan view with an alternate method to attach tethering structure to the portable digital information access/storage device. In some cases the manufactured portable digital information access/storage device does not have an area at the end of it for attaching to a carrying apparatus, but rather a recessed indentation on the side that is designed to have a loop 20 of suitable material inserted through it and wrapped around an internal post. The loop 20 has the large, snap cap end inserted through it and cinched tight which forms a type of closed slip knot that the unit cannot easily separate from. The recessed area offering the post may be too small to accept a standard lanyard hook as shown in FIGS. 1, 2 and 3. This type of coupling could also be used in place of the lanyard hook for rear connection scenarios where desirable.

Loop 20, which may be made of a flexible fabric or synthetic resin or rubber, for example, is secured to cord 4 by cord loop 8 of cord 4.

FIG. 5 shows a fully assembled tethering loop-ended device. It shows the bottom plan view of a strong thread loop 20, compression fitting 6, cord 4, loop 8 and snap post 12 mounted on rear of snap cap socket 10.

Figure 5A:
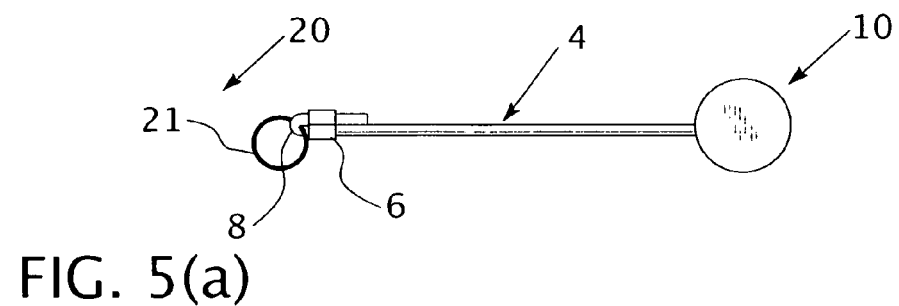
FIG. 5(a) is a top plan view of a modified form of tether.

FIG. 5(a) shows a modified form of tether wherein a split ring 21, which may be of the type commonly employed on keychains, is secured to loop 8. This permits flexibility of securing an attaching structure, such as alligator clip 2 or other fastener, within split ring 21, while also providing a loop, such as loop 20, secured to the tether loop 8 or split ring 21. Further, the split ring may be employed to directly secure a USB flash drive, if desired.

Figure 6:
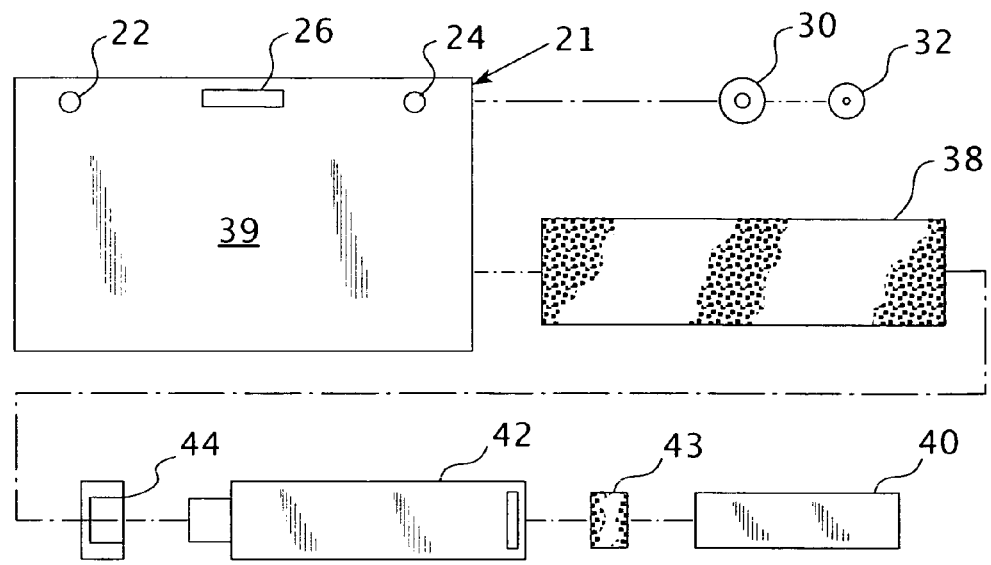
FIG. 6 is an exploded view of a form of identification badge holder, USB flash drive and associated securing elements of the present invention.

Referring to FIG. 6, there is shown an exploded view of horizontal ID badge holder with Velcro (hook and loop) strips and tethering device (not shown) employed to secure the device to back of ID badge holder by two separate retainers. This embodiment totally obscures the portable digital information access/storage device from view of anyone facing the person carrying it. The back side of an industry standard rigid plastic ID badge holder 21 that has small openings 22, 24, respectively, in the upper left and right corners that may be utilized for certain types of lanyards, a slot 26 for insertion of ID strap clips, other spring clip types, and retractable apparatus that secure the badge holder to the carrier or to a lanyard worn around the neck of the carrier. The snap cap socket 30 is shown with its mated snap post 32 that may be used in instances where a riveting type action is utilized to join to two through a small hole. In this embodiment, fastener strips may be employed to secure the portable digital information device 42 to the badge holder. In the form shown, one gender of Velcro strip (a hook-and-loop brand of fastener) 38 with an adhesive backing will be secured to the back surface 39 of the ID badge holder, while one of the mating gender type of Velcro strip 40 will be applied to the portable digital information access/storage device 42 and a shorter one 43 of that same mating gender will be applied to the devices end cap 44. If desired, alternative fasteners may be employed.

This embodiment shows attaching and securing the portable digital information device 42, which, in the form shown, is a USB flash drive to a common identification badge holder 21 as does end cap Velcro 43 through the use of two systems, i.e. it is secured and positioned by a strip of Velcro joined to it by adhesive 40 which cooperates with the Velcro 38 secured to the ID badge holder 21 and (b) it is also secured with a strong, detachable tethering device (not shown in this view).

The snap post 32 may be attached to the back of the identification card holder 21 by way of adhesive, by being embedded during manufacturing of badge holder, or through a small hole where a riveting type action is performed between the snap cap socket 30 and its mated snap post 32 to join the two components together as would be done in standard clothing manufacturing processes. In the instances where a snap post 32 is used to connect the post cap socket 30, the snap post 32 is obscured from the areas of the identification card that is housed on the front of the badge holder so that it will not cause friction against the back of the identification card itself. This is done to resist damaging of the card including magnetic areas containing data where friction over time could damage the cards functionality. This snap post 32 may also be countersunk, covered with a layer of material, or obscured in other manners with the major concept being its ability to add strength to the snap post 32 while not impeding the functionality of the ID card itself, or its ability to be removed and inserted into the holder 21.

As will be described in connection with FIG. 7, Velcro strips are used to position and hold the device in place, as well as tethering a device to give added security. This is done in case the portable digital information access/storage device 42 were to unintentionally become separated from its Velcro attachment. The tethering device 60 employs a snap cap socket 30 and snap post 32 connection to the ID badge holder 21. This requires a significant amount of force to separate and in effect functions as a life line to keep the device connected to the badge holder 21.

Figure 7:
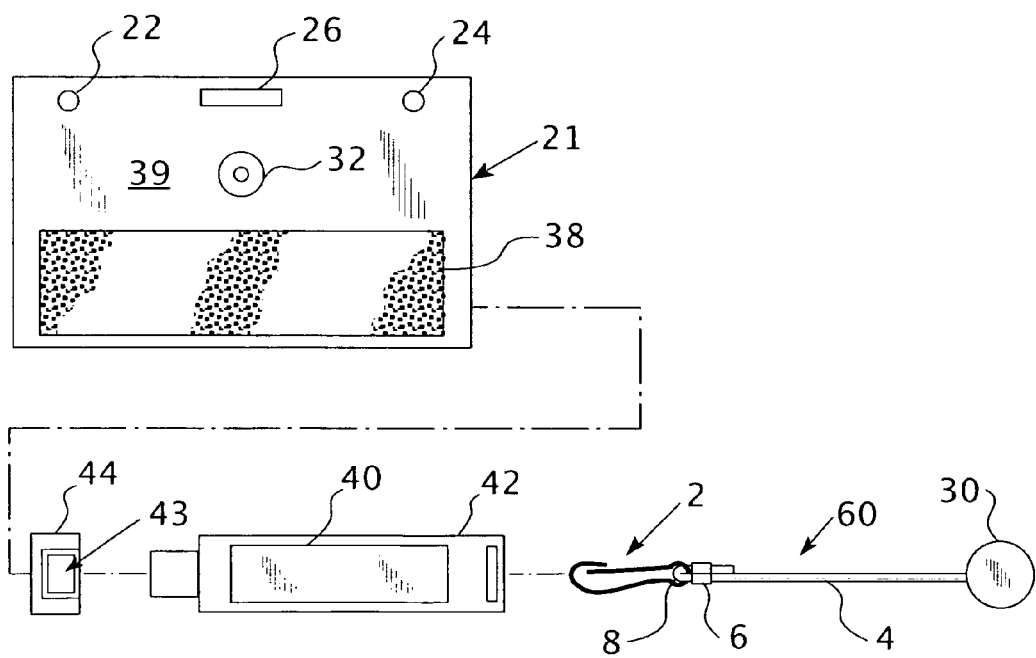
FIG. 7 is an exploded view showing modified structures for securing the USB flash drive to the identification badge holder.

FIG. 7 shows a partially assembled view of the major components shown in FIG. 6 along with those of FIGS. 1 and 2. The snap post 32 has been mounted on ID badge holder 21 by way of post 32 described in connection with FIG. 6, or by way of adhesive. The first type of gender of Velcro strip 38 has being mounted on the rear surface 39 of ID badge holder 21 by adhesive which may be a pressure-sensitive adhesive. The end cap 44 for the portable digital information access/storage device 42 has the second gender type of Velcro strip 43 attached to it by adhesive, while the portable digital information access/storage device 42 has the larger piece of same gender 40 as Velcro strip 43 attached to it. The tethering device shown 60 as seen in FIGS. 1, 2 and 3 could also have in the alternate the tethering device shown in FIG. 4 substituted.

Figure 8:
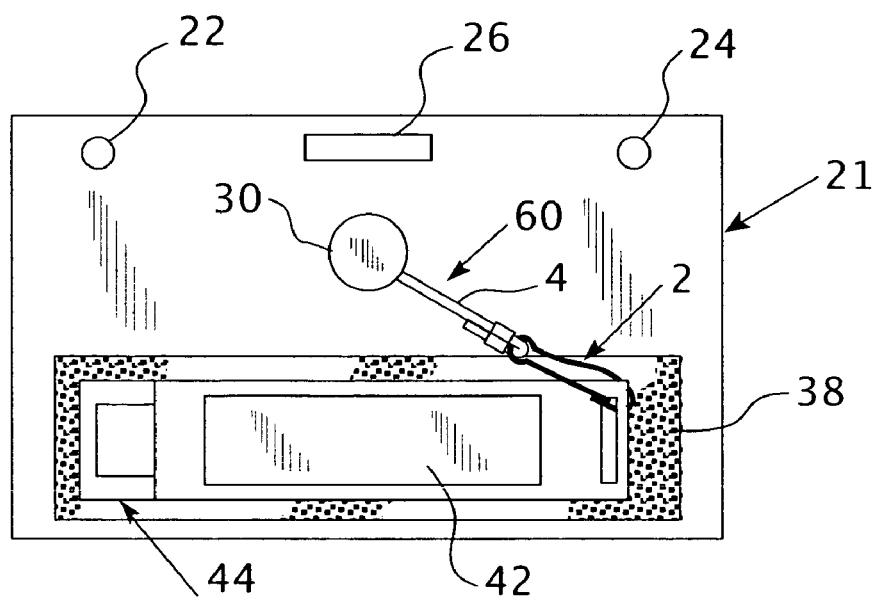
FIG. 8 is a rear elevational view showing a form of hook-and-loop and tether attachment of the USB flash drive to the identification badge holder of FIG. 7 in assembled form.

FIG. 8 shows all of the components of FIG. 7 assembled in the way that they would be worn and carried while the device 42 is not being used. The ID badge holder 21 has the snap cap/socket 60 snapped onto the post 32 (not shown), and the cord 4 is connected to the lanyard hook 2 and attached to the portable digital information access/storage device 42 which is positioned and held to the Velcro strip of the first gender 38 by the piece attached underneath the portable digital information access/storage device 42. The end cap 44 is attached to both the portable digital information access/storage device 42 and the Velcro 38 on the ID badge holder 21 by the Velcro 43 attached to its underside (not shown in this view).

To remove the device and place it into operation, the wearer unsnaps the snap cap 30 and removes the portable digital information access/storage device 42 from the Velcro 38 by pulling on the tethering device 60, or by grabbing the portable digital information access/storage device 42 and prying it away from the Velcro 38, and then insert it into an appropriate port on an information system.

In cases where the portable digital information access/storage device 42 has an end cap such as cap 44 in FIG. 7 covering a USB connector, the small piece of Velcro 43 attached to the end cap 44 may be then be reattached to the Velcro surface 38 while the device 42 is in use. This provides a place to put the end cap 44 where it is unlikely to be lost and can be retrieved easily. An alternative to using the Velcro surfaces 38, 43 would be to put an adhesively attached snap cap socket on the end cap (not shown). It could be attached to the snap post 32 (FIG. 7) when the portable digital information access/storage device 42 and tether device are not connected.

Figure 9:
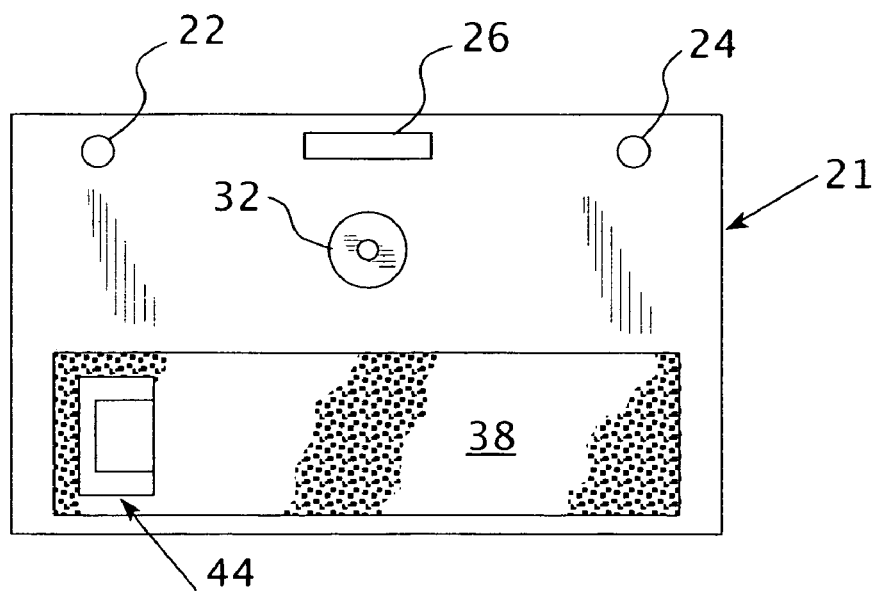
FIG. 9 shows the rear elevation of FIG. 8 without the USB flash drive and tether present.

FIGS. 8 and 9 show the ID badge holder 21 as it would be worn once the portable digital information access/storage device 42 has been removed from the ID badge holder 21, and the tethering device 60 has been unsnapped from the snap post 32. The end cap 44 is replaced on the Velcro strip 38 to store it securely until the device is returned to the back of the ID badge holder 21 to the position shown in FIG. 8.

Figure 10:
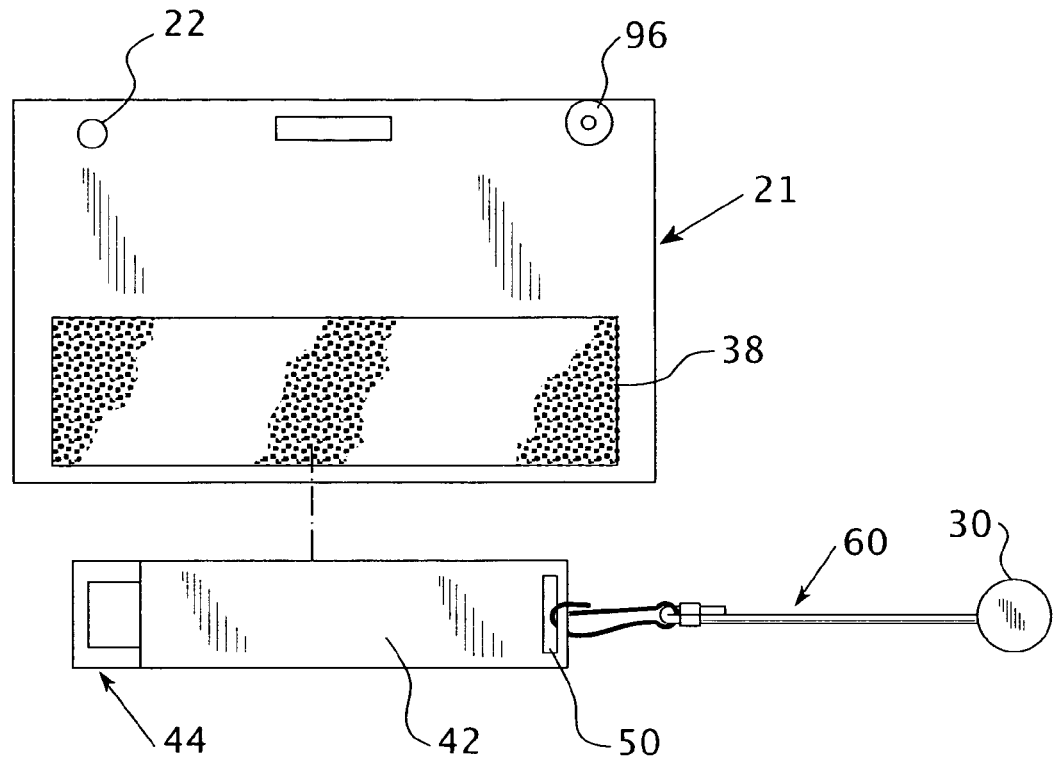
FIG. 10 is a rear elevational view similar to FIG. 9, but showing a portion of the snap button assembly positioned differently along with the exploded portion of a tether and USB flash drive.
Figure 11:
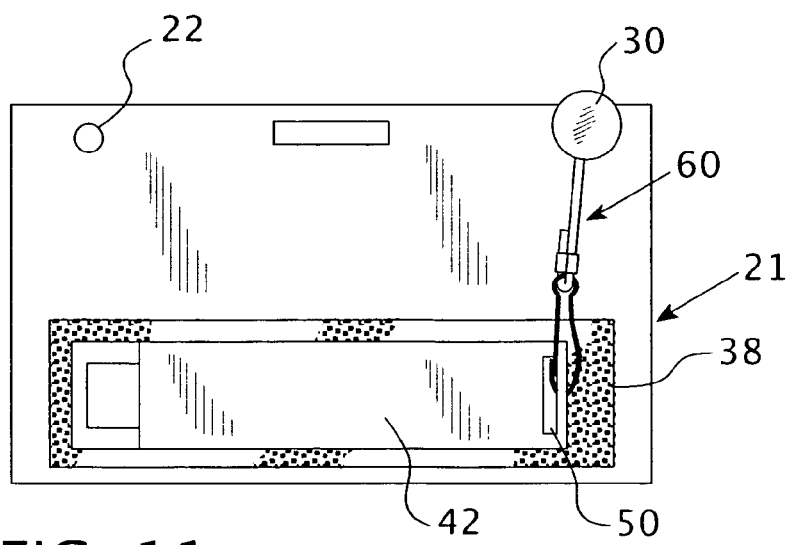
FIG. 11 is a rear elevational view of the embodiment of FIG. 10 in assembled state.

The embodiment of FIGS. 10 and 11 is similar to the embodiment of FIGS. 8 and 9, but utilizes industry standard, pre-existing lanyard mounting holes to mount the snap post 96 through.

In placing the snap button assembly in the upper right or upper left corner through an opening such as 22 or 24 (FIG. 6), a strong available surface is utilized that has a number of advantages potentially over mounting it in other locations on the ID badge holder 21. It does not require any physical modification to existing ID badge holder 21. It also keeps snap post 96 located away from the back of the ID card which is adjacent the front surface of ID badge holder 21 where it could potentially mar it or wear down the magnetic strip as it is slid in and out over time. The top of the ID badge holder assembly 21 is easily reached for without having to feel around for the snap post 96 to begin removal of the portable digital information access/storage device 42, or even verify that the device 42 is on one's person without having to check it visually. As there are preexisting holes on the left and right sides, 22, 24, the snap post 96 could be located at either location to adapt to the convenience of left- or right-handed individuals. Having a large snap cap socket 30 attached to a snap post 96 in an upper corner can allow it to protrude over the edge of the ID badge holder 21 and ID badge 21. This is an advantage as it makes it easier to get one's finger or thumb behind the snap cap socket 30 to pop it away from the ID badge holder 21 when removing the portable digital information access/storage device 42.

FIG. 10 shows the snap post 96 located in the upper right corner of the ID badge holder 21, attached through the right side pre-existing hole 24 (FIG. 9) that may be similar to the left side hole 22. The ID badge holder 21 has a Velcro strip 38 located in the lower half. The portable digital information access/storage device 42 and its end cap 44 both have Velcro of the opposite gender under them secured to the Velcro strap 38 on the ID badge holder 21. The tethering device 60 is connected to the portable digital information access/storage device 42 through slot 50.

FIG. 11 shows the portable digital information access/storage device 42 being carried as would be worn in this horizontal orientation of the tethering device 60 while being held in position by the Velcro strip 38.

Figure 12:
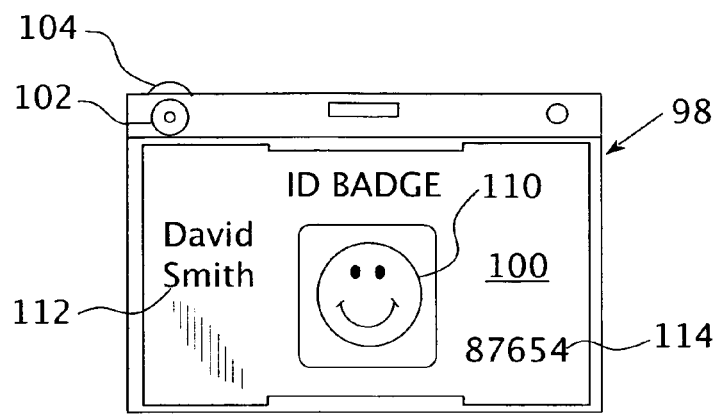
FIG. 12 is a front elevational view of a horizontally oriented badge holder of the type shown in FIGS. 10 and 11 with an identification badge in place.

FIG. 12 shows the front side of the ID badge holder 98 with an ID badge 100 secured thereto, the back side of the snap post 102, and the back side of a large snap cap socket 104. This will facilitate unsnapping the tethering and will still reveal a desired "LOGO" shown on snap cap socket 104. It shows the ID badge 100 provided with the company logo 110 and other desired information such as, for example, an individual's name 112 and an ID number 114.

Referring to FIGS. 13 through 17, a vertical ID badge holder 120 with Velcro strips 122, 140, 142 and tethering device 146 are employed to secure portable digital information device 136 with end cap 138 to the rear face of ID badge holder 120 will be considered. This embodiment is similar to the embodiment of FIGS. 10 through 12, in that it may utilize industry standard, pre-existing lanyard mounting holes 124, 126 to mount the snap cap socket 120 and snap post 130 through.

Figure 13:
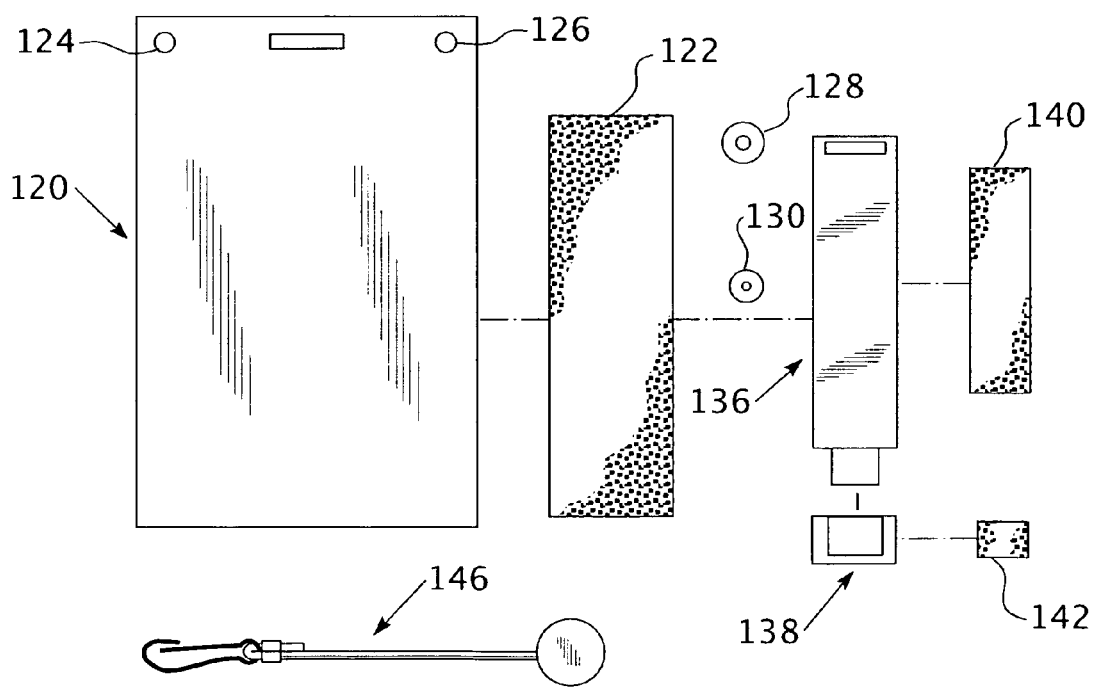
FIG. 13 is an exploded view of a modified form of badge holder and components for securing the USB flash drive to the rear thereof.

FIG. 13 shows a vertical ID badge holder 120, one gender of Velcro 122 with adhesive backing, a snap cap socket 130, snap post 128, portable digital information device 136 and end cap 138 for device 136, large Velcro strip 140 and small Velcro strip 142 and a tethering device 146 of the type shown in FIG. 1 which will include snap cap socket 130.

Figure 14:
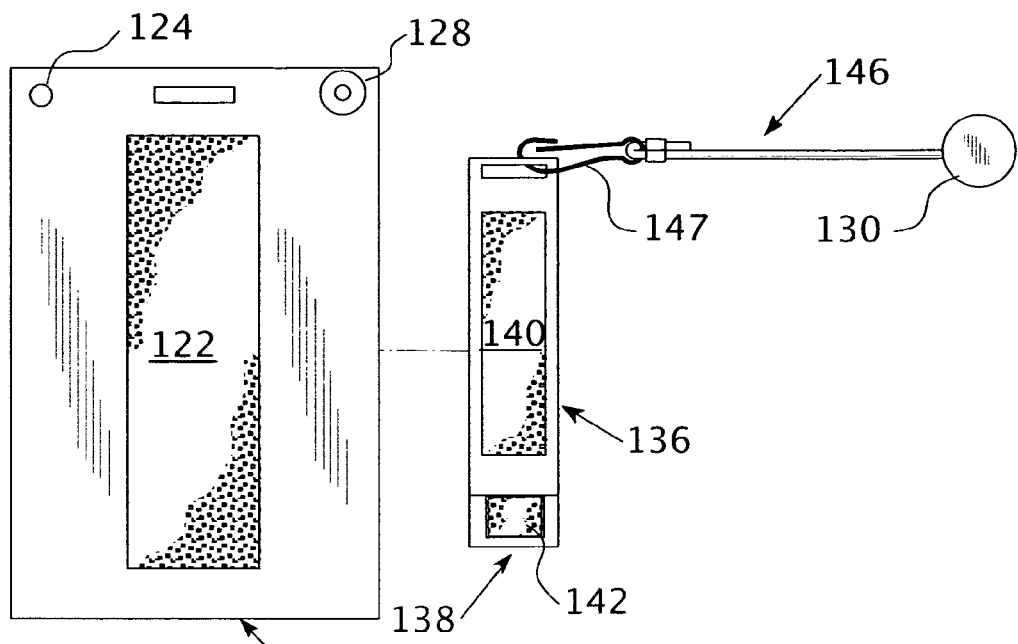
FIGS. 14 through 16 show respectively elevational views of the components of exploded FIG. 13 in various stages of assembly.

FIG. 14 shows an assembly of the major components in their assembled states. The ID badge holder 120 has the Velcro strip 122 attached to it and the snap post 128 through the back of a pre-existing hole 126 (FIG. 13) being utilized. The end cap 138 has a piece of Velcro 142 attached to it and is placed on the end of the portable digital information device 136 which has a piece of Velcro 140 on it. The underside of the portable digital information device 136 is shown. The tethering device 146 is connected to the portable digital information device 136 by lanyard hook 147. The tethering device 146 shown in FIGS. 4 and 5 could also be used as an alternate.

Figure 15:
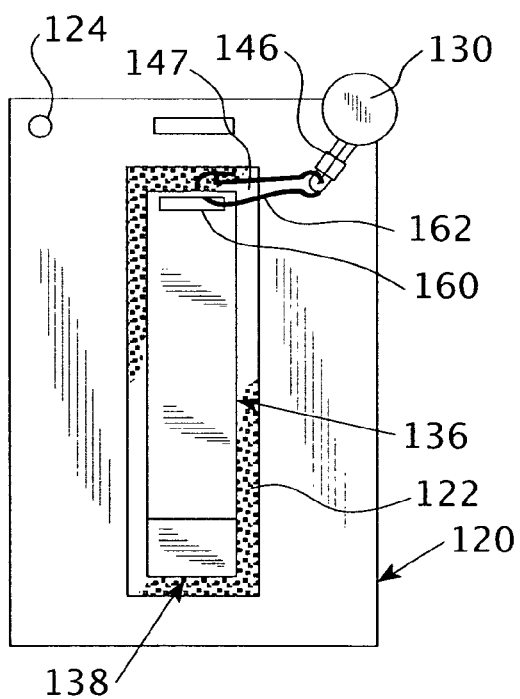

FIG. 15 shows the components of FIG. 14 as they would be assembled while being worn and in transit. The ID badge holder 120 with attached Velcro strip 122 has the portable digital information access/storage device 136 and end cap 138 connected by Velcro strips 140, 142 (FIG. 14) and the tethering device 146 being secured to opening 160 in device 136 by lanyard hook 147. Stud cap socket 130 is secured to snap post 128 (FIG. 13).

Figure 16:
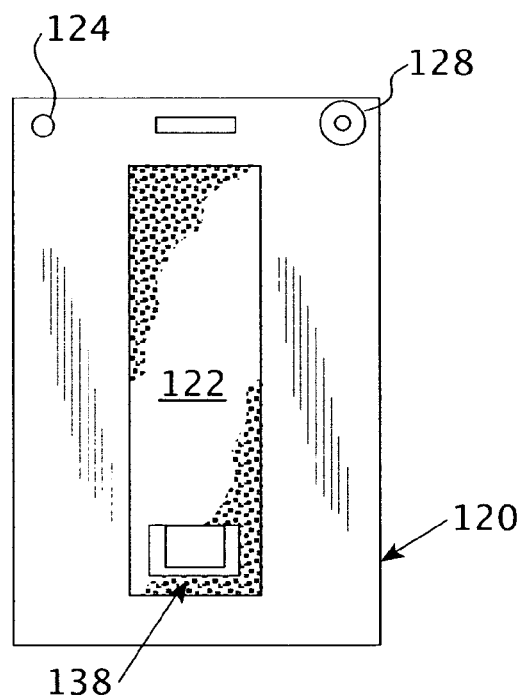

FIG. 16 shows the ID badge holder 120 with Velcro strip 122 and the end cap 138 attached to the Velcro strip 122 while device was in use and not secured to the rear surface of the ID badge holder 120. The end cap 138 is being stored on the back of the badge holder 120 until the device 136 returned to its stored position. The snap post 128 is shown as would be when the tethering device 146 is not present as the portable digital information access/storage device 136 is in use.

Figure 17:
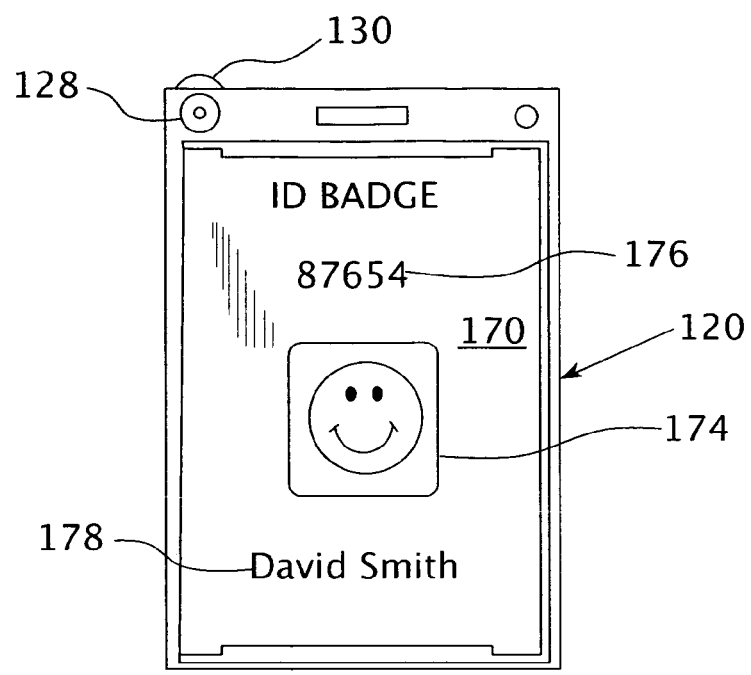
FIG. 17 is a front elevational view of a vertically oriented badge holder of FIGS. 13 through 16 with an identification badge in place.

FIG. 17 shows the front side of the vertically oriented ID badge holder 120 with an ID badge 170, the back side of the snap post 128, and the back side of a large snap cap socket 130 which displays a "LOGO". The ID badge 170 displays a company logo 174. Also shown is an ID number 176 and name 178.

Figure 18:
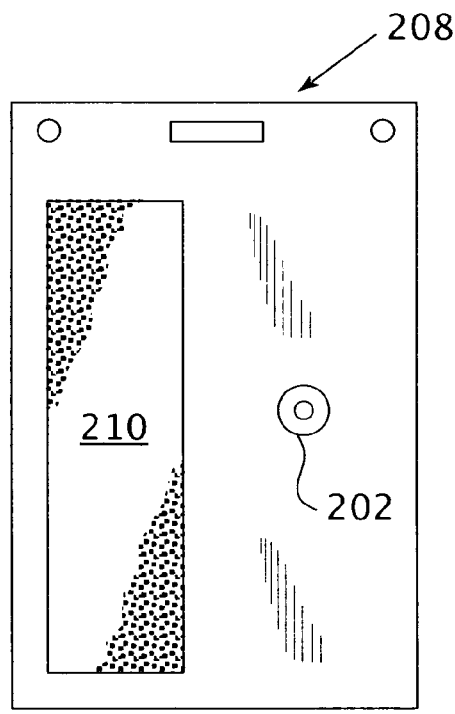
FIGS. 18 and 19 show, respectively, elevational views of the rear of the identification badge holder with and without the USB flash drive and tether in place.
Figure 19:
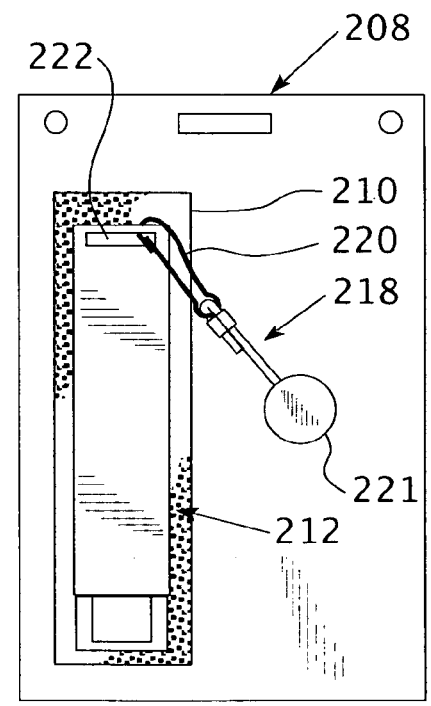

Referring to FIGS. 18 and 19, a further embodiment which is similar to that of FIGS. 14-17, but offers an alternative position to mount the snap post 202 so that the portable digital information access/storage device 212 and tethering device 218 are not in sight from the front of the Identification badge holder 208. Snap post 202 can be mounted by adhesive, with a matching riveted post that is countersunk or inserted through the back in such a way as to not mar the back side of the inserted ID card, or engulfed or covered by a material as to obscure it from the back of the ID card. The portable digital information device 212 may be positioned left of center, or anywhere that the ID badge holder 208 would most effectively balance to keep it hanging straight when worn by a person.

FIG. 18 shows a vertical ID badge holder 208 with the snap post 202 located right of center and the Velcro strip 210 located left of center.

FIG. 19 shows the ID badge holder 208 described in connection with FIG. 18 in a populated state as it would be while being worn and carrying the portable digital information access/storage device 212. The device 212 is positioned and held in place by the Velcro strip 210. Additional security is offered by the tethering device 218 which has clip 220 secured through opening 222 and also secured by snap cap socket 221 to snap post 202.

Referring to FIGS. 20 through 25, a further embodiment will be considered. This embodiment may be incorporated with other embodiments of this invention. It adds an option to store the end cap 46 in a manner which makes it readily accessible. It may be employed in both horizontal and vertical ID badge holder orientations. A holder 240, which may be rubber, metal, plastic or other suitable material, is attached to the ID badge holder 242 and rests relatively flat while in a storage position. When it is to be used for holding the end cap 46 while the portable digital information access/storage device 56 is being used, the hinged cap holder 240 is pulled away from its storage position against the ID badge holder 242 and extends to a variety of angles A preferably up to about 30 to 55 degrees. Small physical notches may be molded in the structure and hinge as to give suggested resting positions that may best accommodate user preference and varying end cap proportions. This cap holder 240 can also potentially utilize a spring in the hinged area to make its natural resting state against the ID badge holder 242 and to resist flipping into the downward, extended position where it could poke the wearer. As many end caps are designed to attach to USB connectors of portable digital information access/storage devices, the end of this holder is shaped like a standard USB connector as to allow the end cap 46 to engage the cap holder 240 in intimate fashion.

FIG. 20 shows the end cap holder 240 mounted on a horizontal ID badge holder 242 with the other elements present as described in connection with FIG. 11.

FIG. 21 shows an enlarged view of the structure of FIG. 20 as seen in the upper left area of a horizontally oriented ID badge holder 242. The hinge assembly 262 is shown at the bottom of the structure 240. The top of the structure 264 is in the shape of a USB connector. The hinge 262 may be any suitable type. In the form shown, the lower end of the holder 240 has a pair of spaced passageways 270, 272 through which pin 274 passes. The passageways are rotatable with respect to pin 274 which has its end portions secured with bushings 280, 282 which are in turn secured to ID badge holder 242.

FIG. 22 shows a side view of the ID badge holder 242 with holder 240 extended as it would be when preparing to receive an end cap. It is inclined with respect to the ID badge holder at an angle A which preferably may be about 30 to 55 degrees.

FIG. 23 shows a side view of the ID badge holder 242 with extended cap holder 240 inserted into end cap 46 and being held there by frictional engagement.

FIG. 24 shows a side view of the ID badge holder 242 with the cap holder 240 rotated back towards the ID badge holder 242 after it has been inserted into the end cap 46 to reduce the amount of angle A and distance the cap holder 240 projects. This allows the assembly to remain relatively flat.

FIG. 25 shows the assembly similar to FIG. 20, but with a vertically oriented ID badge holder 244 and the cap holder disposed at a different position. Tether 250 secures device 56 by clip 252 through opening 254. Also, Velcro 256 is employed to secure device 56.

Figure 26:
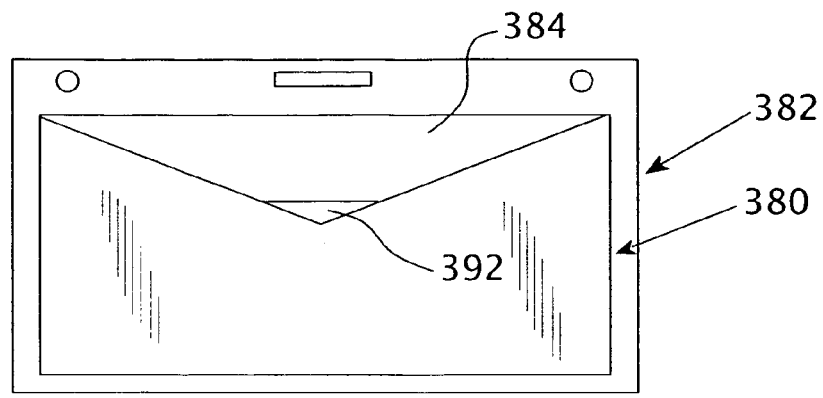
FIG. 26 is a rear elevational view of an ID badge holder of the present invention with a container attached thereto which is in the closed position.
Figure 27:
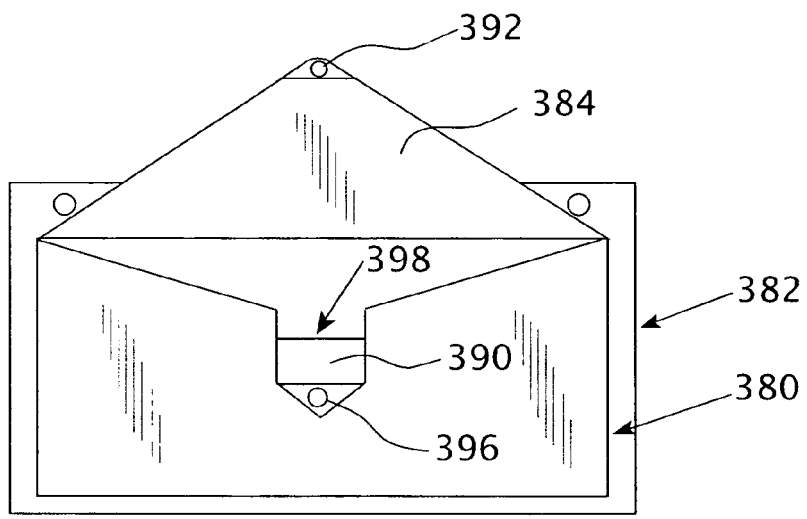
FIG. 27 is a rear elevational view of the container of FIG. 26, with the container in the open position.
Figure 28:
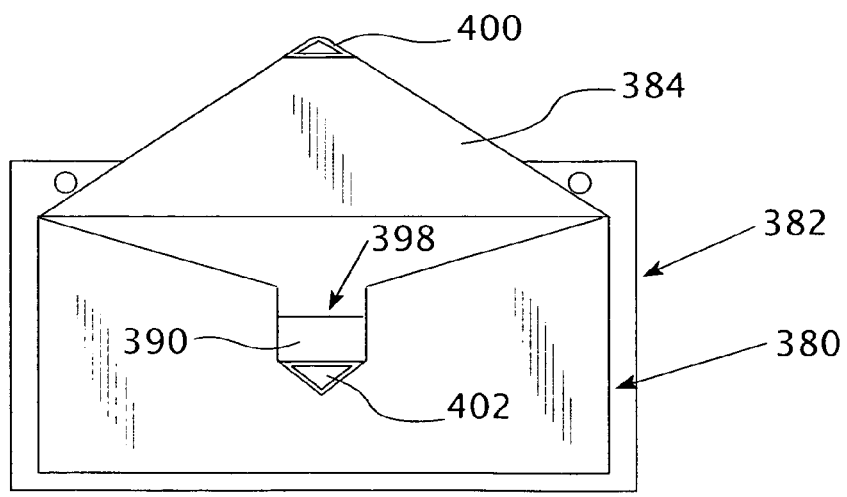
FIG. 28 is a rear elevational view similar to FIGS. 26 and 27, but with a different form of latching system.

FIGS. 26-28 show an embodiment having an envelope-type structure 380 secured to the rear of ID badge holder 382 and having an overlying flap 384 that allows the portion it mates to, to be lower. This allows for easier access to the device it is carrying as it would likely be in a horizontal orientation in this case and gravity would cause the device to lie on the bottom of the envelope 380. A slot 390 (FIG. 27) is left open in the lower section of the case 380 to allow for touching the device with ones finger or thumb to easily slide it up and bring it out. This envelope 380 is also an ideal place to put a device end cap for temporary storage when not in use.

FIG. 26 shows the container or envelope 380 in a closed state with a flat snap cap socket 392 on the flap 384 (FIG. 27), which cooperates with snap post 396.

FIG. 27 shows an envelope body 380 in an open state with the snap socket 392 on the interior flap side 384. The snap stud 396 is shown below an upper portion of device 398 which is partially revealed through the access slot 390.

FIG. 28 shows a Velcro latching version of the envelope 380 in an open state with one gender piece of Velcro 400 on the interior flap 384 and the other gender of Velcro piece 402 is shown below the upper portion of device 398 which is partially revealed through the access slot 390.

The embodiment of FIGS. 29-32 consists of attaching a device retainer 408 which is composed of material with elastic properties that is attached to the back of the ID badge holder 410 (horizontal) or 412 (vertical). Device retainer 408 is anchored to the holder 410 on the top horizontal edge 420 and bottom horizontal edge 422 leaving the left and right sides 424, 426 open to create a general, horizontal, elastic sleeve defining a passageway for receipt of a portable electronic information device 430. The retainer 408 can be attached to the badge holder 410 by way of adhesive, stitching, by fusing to the badge card holder, or any way that will allow it to be secured in a manner that will withstand use and function as needed.

Figure 29:
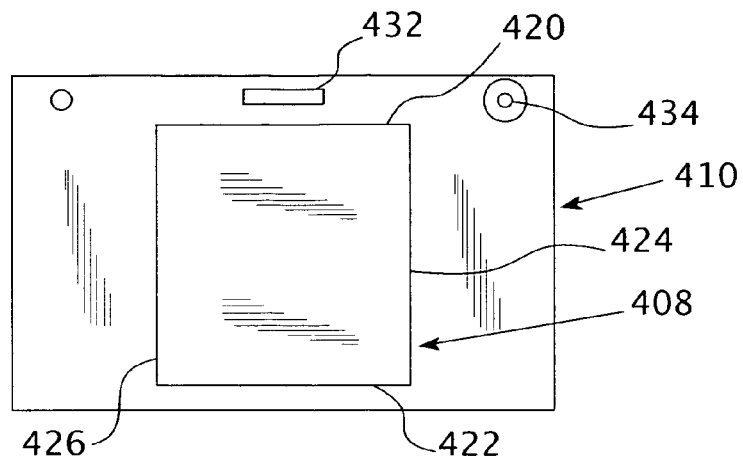
FIG. 29 illustrates a rear elevational view of another embodiment of the invention wherein an elastic material defines a generally horizontal passageway for receipt of the USB flash drive.
Figure 30:
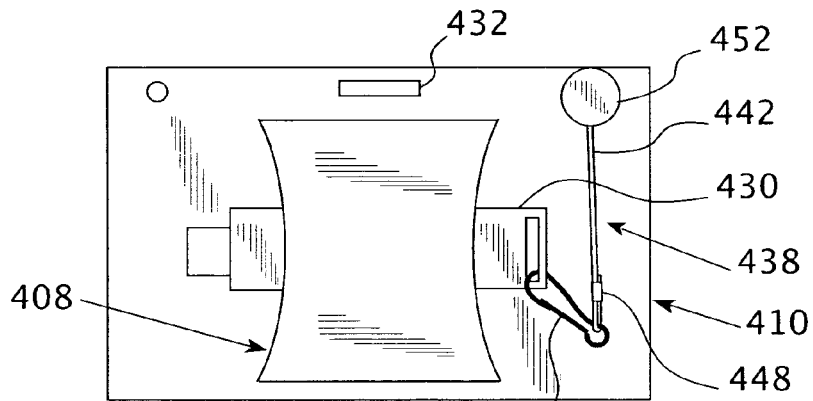
FIG. 30 shows a USB flash drive secured within the passageway of FIG. 29 and also attached to the ID badge holder by a tether.

FIGS. 29 and 30 show the back face of the ID badge holder 410 with device retainer 408 attached. If desired, a lanyard, such as one with a loop for receiving the user's neck, may be secured to ID badge holder 410 through slot 432. A snap post 434 is secured in the upper right corner of the badge holder 410. FIG. 29 shows the invention in a dormant state as would occur when a portable digital information device that has served as payload has been removed for use.

FIG. 30 shows a portable digital information device 430 inserted and resiliently retained in the device retainer 408 as it would be while being worn on the back of an ID badge holder 410. The elastic is expanded to accommodate the device 430 and provide positioning against the back of the ID badge holder 410 as well as level of security to hold it in place. A tethering device 438 consisting of a lanyard hook 440, cord 442 with a compression fitting 448 to secure it to lanyard hook 440, and a snap socket cap 452 provides a strong and secure secondary holding system to resist potential loss or damage should device 430 move out of position from the resilient sleeve of device retainer 408 unexpectedly. A loop of cord material (not shown) may also be used in the tethering device as opposed to the lanyard hook for portable electronic information devices that offer a smaller area for attachment. See, for example, loop 20 in FIGS. 4 and 5.

Figure 31:
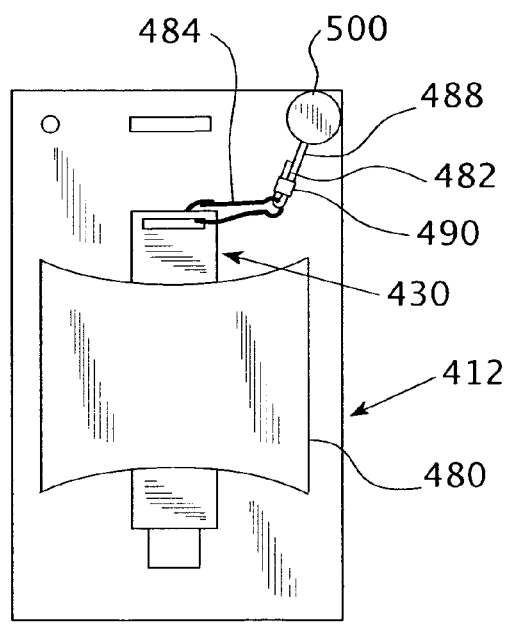
FIG. 31 is an elevational view similar to FIG. 30, but with a vertically oriented ID badge holder.

FIG. 31 shows a vertical version of the assembled apparatus that is shown in FIG. 30. Portable digital information device 430 is inserted into the elastic device retainer 480 as it would be while being secured to the rear surface of ID badge holder 412. The elastic is expanded to accommodate the USB flash drive 430 and provide intimate positioning against the rear surface of the ID badge holder 412 as well as security to hold it in place. A tethering device 482 consisting of a lanyard hook 484, cord 488 with a compression fitting 490 to secure it to lanyard hook 484, and a snap cap socket 500 provide a strong and secure secondary holding system to resist potential loss or damage should the device move out of position in the device retainer 480 unexpectedly. If desired, an elastic band (not shown) or other transversely outwardly projecting member secured to the device 430 may be provided to engage the upper edge of elastic device retainer 480 in order to resist undesired downward movement of device 430.

Figure 32:
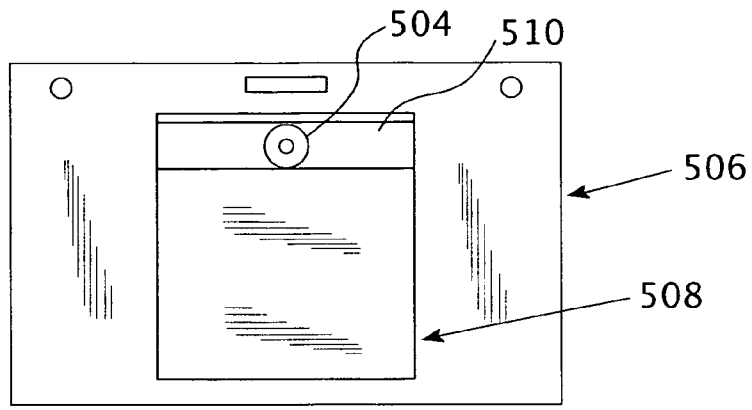
FIG. 32 shows a modified form of elastic passageway having a portion of a snap button assembly secured thereto for securing a tether.

FIG. 32 shows another version of the system where the snap cap post 504 is mounted on the device retainer 508 on the rear face of ID badge holder 506 and secured to an overlying heavier piece of material 510 that preferably does not have elastic properties.

In the configurations of FIGS. 29-32, the device is attached to the ID badge holder 410 by sliding it into a device retainer 408, 480, 508 and then snapping a cap socket such as 452, 500 on the tethering device to the snap post 434, 504 for added security. Removing the device for use simply requires unsnapping the snap button such as 452, 500 and sliding the device out of the retainer sleeve 408, 480, 508.

If desired, the device retainer 408, 480, 508 may be secured to the ID badge holder 410, 412, 506 on three sides to create a pocket on the bottom of the vertical orientation to resist natural movement and gravity sliding the device down over time when the ID badge holder 410, 506 is worn.

Figure 33:
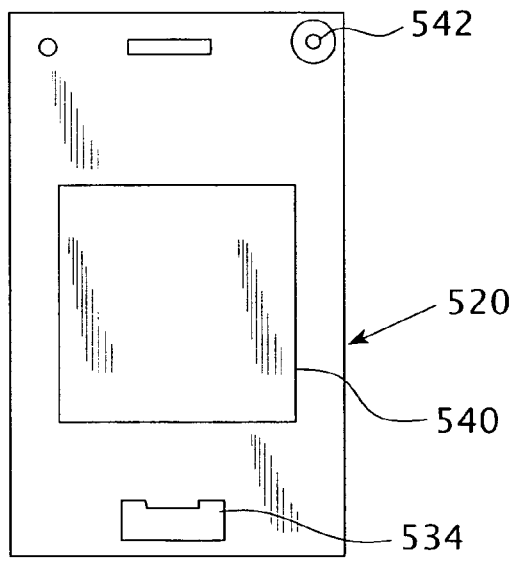
FIGS. 33 and 34 show, respectively, a rear elevational view of a vertically oriented ID badge holder having an elastic sleeve and supplemental recess secured to the same for receiving the lower portion of a USB flash drive and such a structure with USB flash drive in place.
Figure 34:
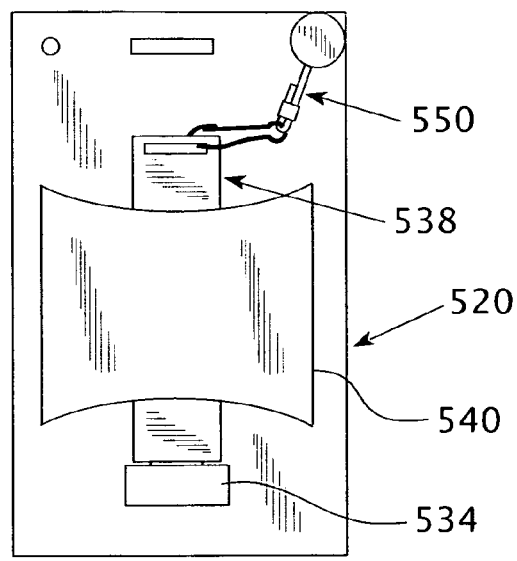
Figure 35:
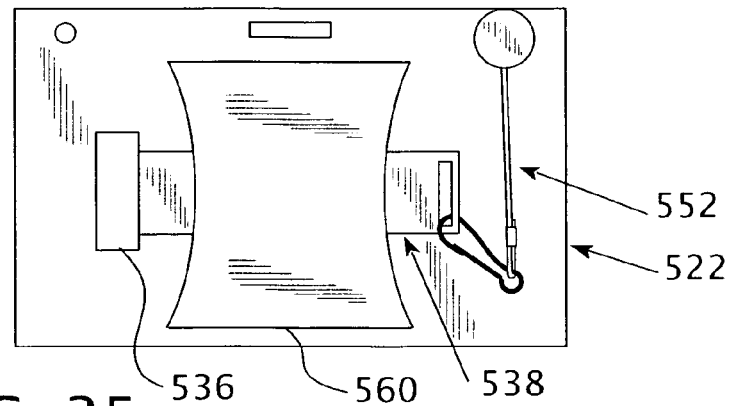
FIG. 35 is a rear elevational view of a horizontal embodiment similar to FIG. 34, which has a tethered connection to the USB flash drive.

The embodiment of FIGS. 33-35 employs the fact that portable digital information device such as USB flash drive 538 with USB connectors adhere to one end having a standardized connector on it. By virtue of this commonality, these devices can forgo using end caps and simply slide into an upwardly open receiver 534 (FIGS. 33, 34) or horizontally open receiver 536 (FIG. 35) designed to be generally the same dimensions as a standard computer USB port. The receivers 534, 536 could be made of rubber due to its inherent properties of grip and moisture resistance or other suitable materials. With the USB end of the device inserted into the receiver 534, 536, the rest of the device 538 could be secured in a number of ways. One such structure would be to employ an elastic sleeve that is secured to ID badge holder 520, 522 to provide a passageway which aligns lengthwise with the receiver 534, 536 and creates an elastic form-fitting tunnel to insert the portable digital information access/storage device 538 into. The elastic material sleeve 540, 560 used can be of varying length related to the amount of exposure the portable digital information access/storage device 538 might have. If desired, a tethering device such as 550, 552 may be used for additional security in combination with the elastic sleeve retainer, 540, 560.

If desired, receivers 534, 536 could have a solid surface to contact the USB flash drive rather than a recess for receipt of the same.

If desired, the receiver 534, 536 could also be disposed in a container such as described in other embodiments in this invention. In those cases, it would facilitate a secure fit of the device within the container and would eliminate the need for cumbersome separate device end caps as the device 538 would always be protected in transit, and would lessen the likelihood of the device making noise in jostling around and bumping against the ID badge holder 520, 522 while the user is in motion.

Another approach for using the USB port-shaped receiver would be to have a piece placed on the opposite end of the portable digital information device 538 which would allow for adjustments in the length of various devices. This could compress itself against the opposite end of the device 538 thereby securing the device in the USB port sized receiving end. It could be spring-loaded which would allow it to slide back and forth towards and away from the device for insertion or release. Another potential format for this opposite end piece would be for it to lock into place. In this case, it would have a bottom, two sides, and a flip-up top. The top would flip up to allow insertion of the portable digital information device 538 into it and the USB port-sized receiving end. The device would be inserted into the USB receiver end first, and then into this end. Once in place, the flip top would be locked down, thereby holding it in place and securing it.

The USB port-sized receiver end preferably would have the ability to pivot, or adjust to accommodate various size devices that while having the standard size USB connector, may have varied heights causing a need for some variance in position. The pivoting aspect facilitates adapting to situations where devices are inserted at an angle such as with the flip top opposite end.

The USB port-sized receiving end can also be made of the standardized width with the slot cut higher to allow for the various heights of portable digital information access/storage device 538 that would cause the devices USB connector to be disposed at various distances away from the ID badge holder 520. While this would not engage the USB connector on all four sides, it would on at least two sides. Due to the fact that the front of the connector would be pressing against rubber or other suitable material, the internal portions of the connector would gain protection. The structure could also provide shim pieces that could be set in place during a one-time setup that would help close any height gaps.

FIG. 33 shows a vertical ID badge holder 520 with the upwardly open USB port-sized receiver 534, an elastic sleeve-type device retainer 540, and a snap post 542. This figure shows the apparatus when USB flash drive is in use and out of retainer 540.

FIG. 34 is a populated version of FIG. 33 where a portable digital information access/storage device 538 is inserted through the elastic sleeve device retainer 540, the USB connector is inserted into the USB port-sized receiver 534 and an optional tethering device 550 is in place as a second form of security.

FIG. 35 shows a horizontally oriented assembly which can employ the same principles as FIGS. 33 and 34 in connection with ID badge holder 520. Portable digital information device 538 is inserted through the elastic sleeve device retainer 560, which is secured to ID badge holder 522, the USB connector is inserted into the USB port sized receiving end 536 and an optional tethering device 552 is employed.

Figure 36:
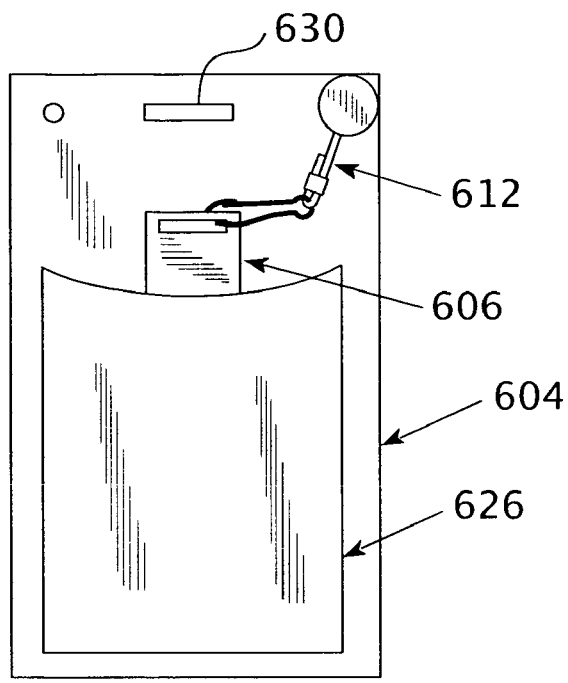
FIG. 36 is a rear elevational view of an upwardly open pouch within which the USB flash drive is received and a tether for securing the same in position.
Figure 37:
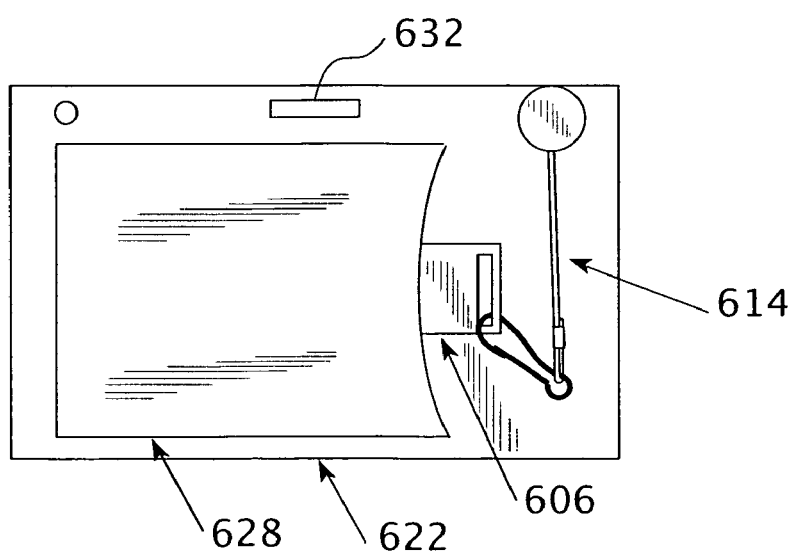
FIG. 37 is a rear elevational view similar to FIG. 36, but showing a horizontally oriented ID badge holder.

Referring to FIGS. 36 and 37, this embodiment utilizes a flexible synthetic or natural material to create a structure 626, 628 that is closed on three sides and allows for USB flash drive 606 insertion on the fourth side. The material can be of an elastic type which is secured to ID badge holders 604, 622 and automatically adjusts to a variety of device sizes and shapes. This structure can also hold an end cap when the device 606 is in use and out of the structure 626, 628.

FIG. 36 shows a vertical orientation of an upwardly open pouch 626 secured to ID badge holder 604. The portable digital information device 606 is inserted in the pouch 626 as it would be while being worn. An optional tethering device 612 is in place as an additional security device.

FIG. 37 shows a horizontal orientation of pouch 628 secured to a horizontal ID badge holder 622. The portable digital information access/storage device 606 is inserted into and received in pouch 628 which is secured to the rear face of holder 622. Pouch 628 is shown as it would be while being worn. An optional tethering device 614 is in place.

In both FIGS. 36 and 37, there are provided, respectively, slots 630, 632 for securing the ID badge holder 604, 622, respectively, to the person.

Figure 38:
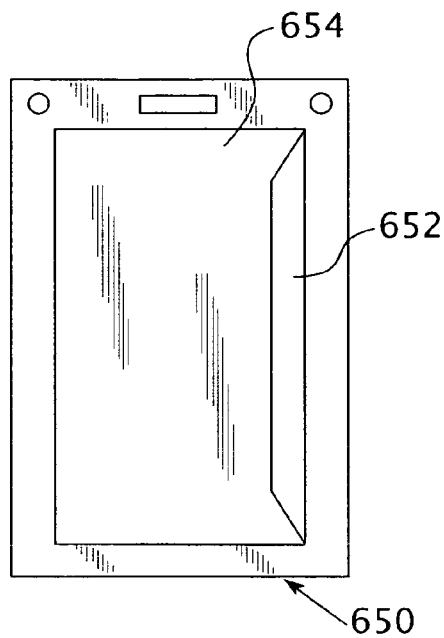
FIG. 38 is a rear elevational view showing a structure having a recess secured to the rear face of the ID badge holder with a drawer in a closed position.
Figure 39:
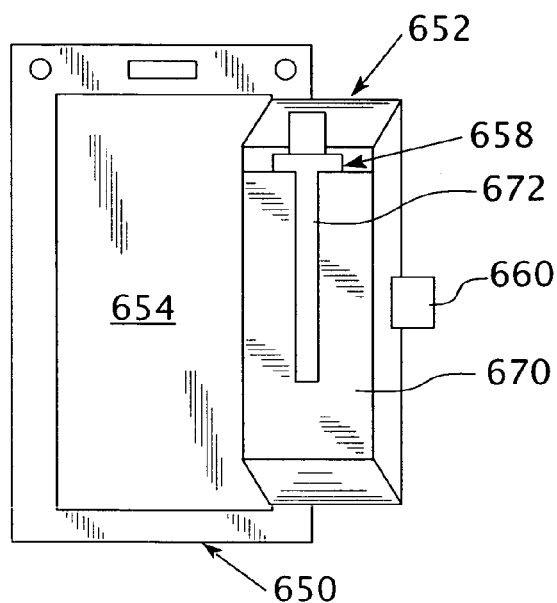
FIG. 39 is a similar view to FIG. 38, but shows the drawer in the open position.

FIGS. 38 and 39 show an embodiment of the invention which has a vertical orientation ID badge holder 650 with slide-out drawer 652. The drawer 652 slides out to right, in the form shown, as statistically a larger number of people are right-handed; however, sliding to the left could be provided as an alternate construction. Holder 654 may have some padding inside to minimize bouncing around of the device 658. This embodiment could also employ an elastic-type retainer, such as 626 (FIG. 36) inside the drawer to hold device 658 in place.

The drawer 652 can be made to open in a number of ways. These include, for example, (a) pushing in on drawer which may unlatch and then open or (b) opening could be by pulling out on a grip-able surface or handle 660 or (c) opening could be effected by freeing a latching mechanism and sliding the drawer 652 out or (d) any desired alternate means.

Once the drawer is open, a front wall 670 which holds device 658 in a vertical plane is in view. The front wall 670 has an elongated, upwardly open slot 672 in the middle to allow insertion of a thumb or finger to easily engage and pull the device 658 up and out while the front wall 670 cradles and retains device in place to resist it from falling out.

FIG. 38 shows the drawer 652 in the closed position as would be during transport, or when the device is stored in the drawer and not in use. The ID badge holder 650 has the pouch 654 with receiver drawer 652 secured to the rear surface 658.

FIG. 39 shows the drawer 652 in the open position with the pouch 654 secured to the ID badge holder 650. The portable digital information access/storage device 658 is kept in place within the drawer 652 until it is moved up and out for use.

Figure 40:
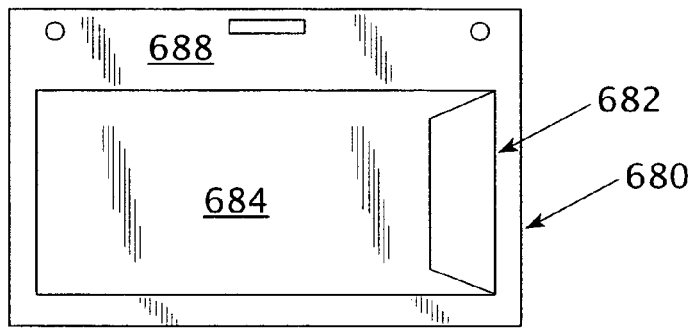
FIG. 40 shows a rear elevation of a modified form of recess and drawer on a horizontally oriented ID badge holder with the drawer in the closed position.
Figure 41:
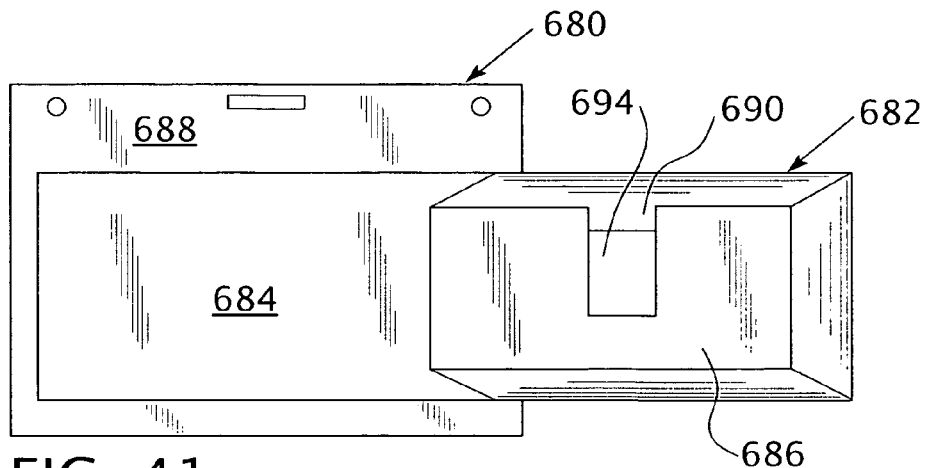
FIG. 41 shows a similar rear elevation to FIG. 40 with the drawer in the open position.

A horizontally oriented ID badge holder 680 with slide out drawer 682 that slides is shown in FIGS. 40 and 41. The structure and function are similar to the structure of FIGS. 38 and 39, but the drawer 682 has a horizontally elongated front wall 686 with slot 690 and device 694 being generally horizontally oriented.

The drawer 682 can be built to open in a number of ways as set forth in connection with FIGS. 38 and 39.

FIG. 40 shows the drawer 682 in the closed position as it would be during transport, or when the device is not in use. The pouch 684 is secured to the ID badge holder 680.

FIG. 41 shows the drawer 682 in the open position with the pouch 684 secured to the rear surface 688 of ID badge holder 680. In the drawer 682, the portable digital information device 694 is kept in place in the drawer 682 until it is manually engaged through slot 690 and slid upwardly and out of drawer 682 for use.

Figure 42:
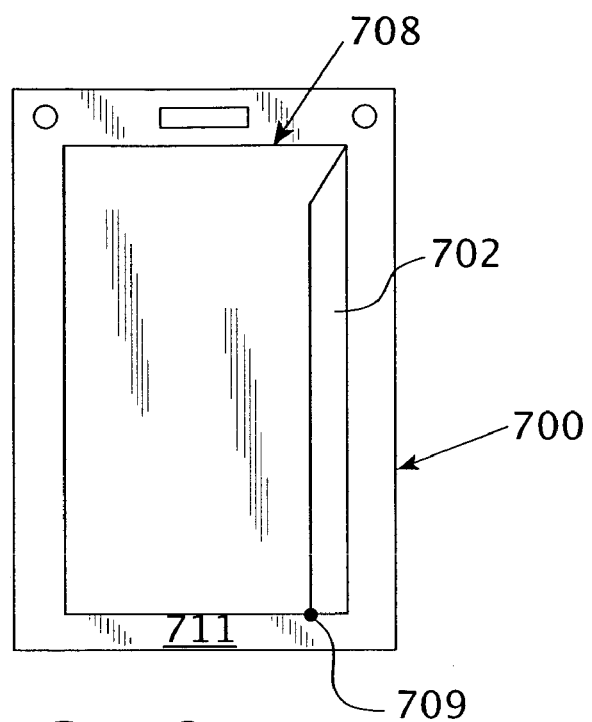
FIG. 42 illustrates a rear elevation with a recess and drawer secured to the rear face of a ID badge holder with the drawer in the closed position.
Figure 43:
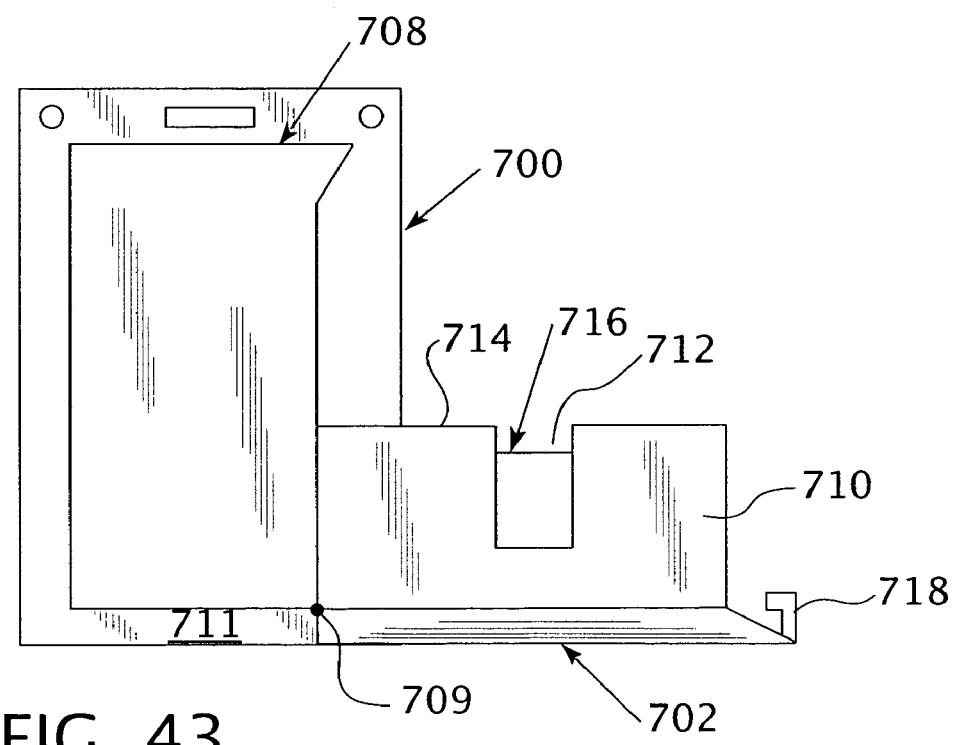
FIG. 43 is a rear elevation of the assembly of FIG. 42 with the drawer rotated to an open position.

Referring to FIGS. 42 and 43, this is a vertically oriented ID badge holder 700 that has a pouch 708 which houses a container 702 with swing arm assembly that rotates about a lower hinge 709 and opens and closes by rotation between the closed position of FIG. 42 and the open position of FIG. 43.

The container 702 can be moved from a closed position as shown in FIG. 42 within pouch 708 which is secured to badge holder 700 to as much as 90 degrees from its closed position. When closed, as shown in FIG. 42, the container is a four-sided box. When open, the right side swings down on hinge 709 disposed on the bottom right side. The right side has a front wall 710 which has an upwardly open slot 712 which cradles device 716 to facilitate hand removal and return by the user. A latching mechanism which may be any structure known to one skilled may be a resilient male element 718 which engages with a female member (not shown) located on the upper right where it is less likely to be inadvertently opened. A resilient device retainer such as shown in FIGS. 29-37, for example, may be disposed in container 702 to releasably engage the device in a closed position inside the pouch and can be added to secure the device 716 from bumping around or potentially falling out, if desired. The inside of the container 702 can be padded and an end cap can be stored in the container 702 when the device 716 is in use. The device 716 is moved upward through an opening at 714 by pushing it up by engagement through the slot 712 in the front wall 710.

FIG. 42 shows the container 708 secured to the rear surface 711 of the ID badge holder 700 with the rotatable container 702 in a closed position.

FIG. 43 shows the container 708 secured to the rear surface 711 of the ID badge holder 700 with the swing arm 702 in an open position. The device 716 is cradled while the front wall 710 allows for easy removal through its slot 712. If desired, a suitable hinge or stop member (not shown) could be provided to limit downward motion of container 702, as will be known to those skilled in the art.

Figure 44:
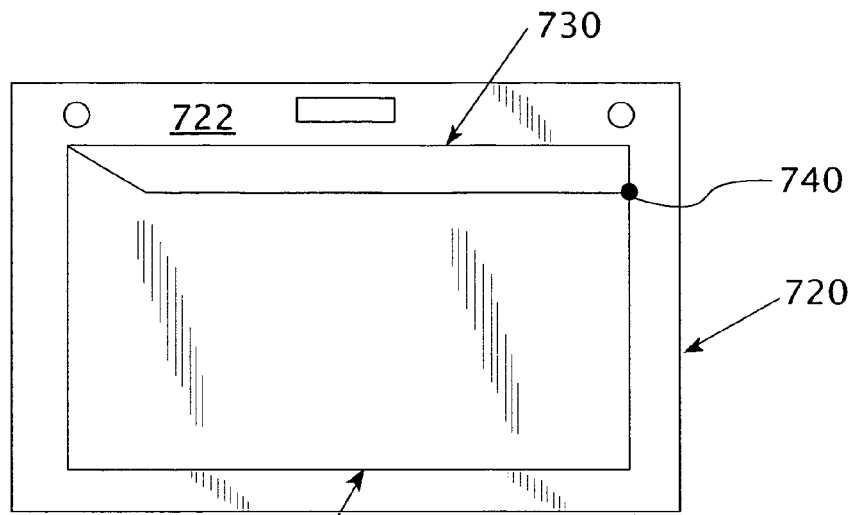
FIG. 44 is a horizontally oriented ID badge holder having a drawer in a closed position.
Figure 45:
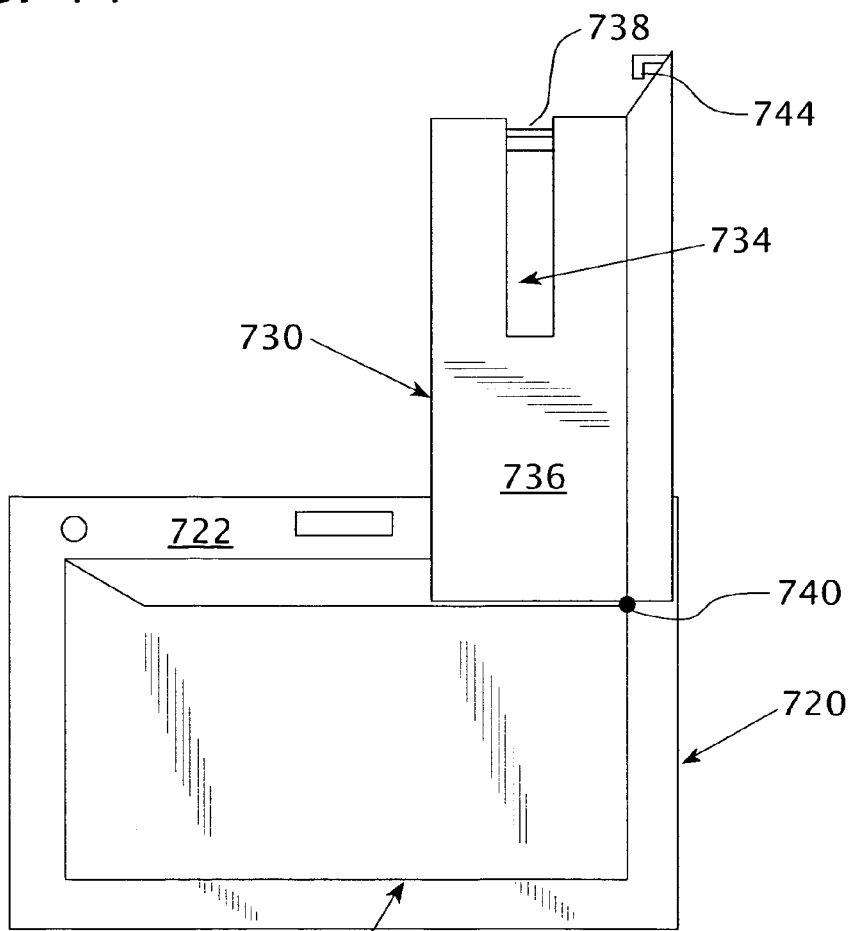
FIG. 45 is a rear elevational view of the assembly of FIG. 44 with the drawer rotated to an open position.

FIGS. 44 and 45 show a horizontal ID badge holder 720 having a rotating swing arm as in FIGS. 42 and 43.

FIG. 44 shows the container 724 secured to the rear surface 722 of a generally horizontally oriented ID badge holder 720 with the swing arm 730 in a closed position.

FIG. 45 shows the container 724 secured to the rear surface 722 of the ID badge holder 720 with the swing arm 730 which has slot 738 in an open position. The device 734 is cradled in container 730 while the front wall 736 allows for easy removal of device 734. A hinge 740 and male latching member 744 are shown.

Figure 46:
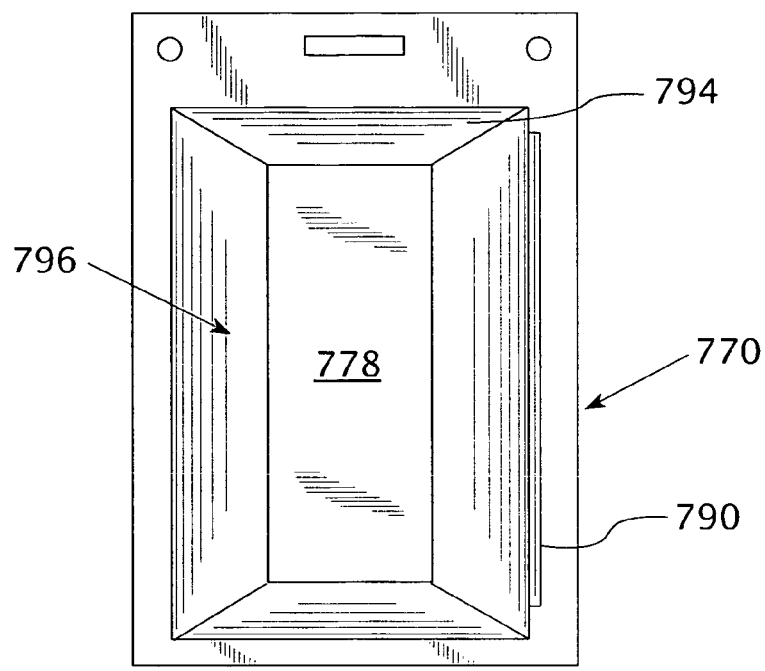
FIG. 46 illustrates a rotatable container secured to the rear face of an ID badge holder.
Figure 47:
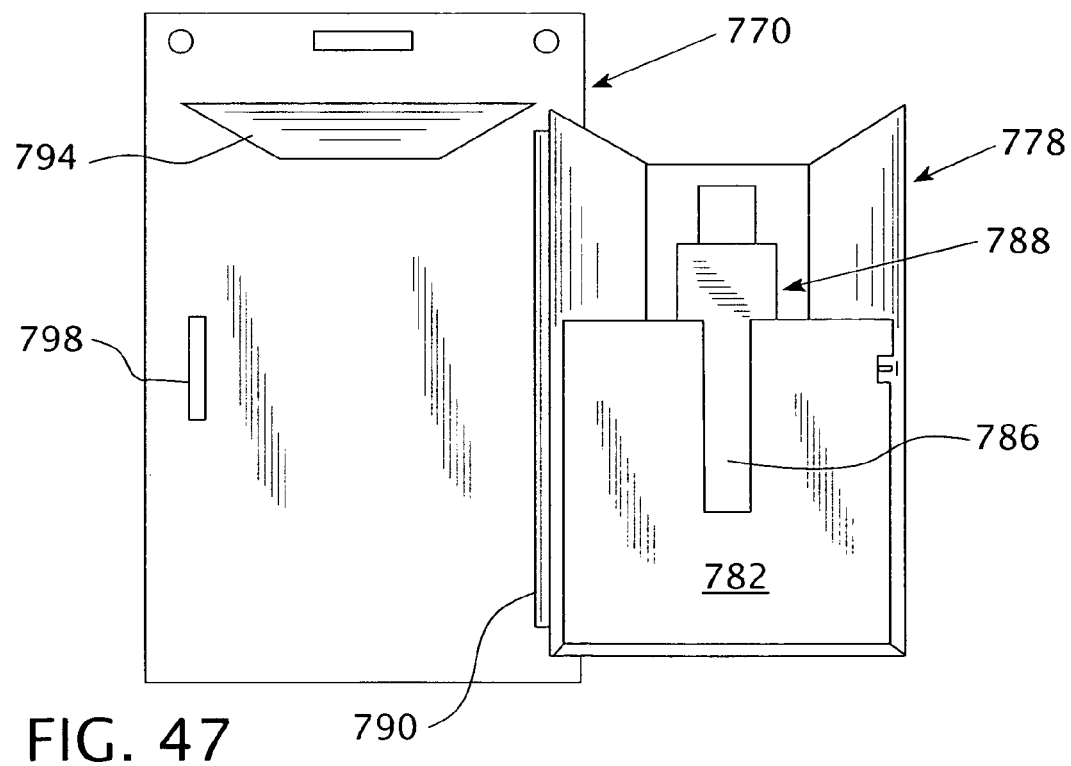
FIG. 47 shows the rear elevational view of the container of FIG. 46 with the container rotated to an open position.

FIGS. 46 and 47 show a further embodiment which is a generally vertically oriented embodiment. It has an ID badge holder 770 to which a container 778 is secured by vertically oriented hinge 790. The container 778 has a front wall 782 with slot 786 with USB flash drive or device 788 positioned therein. The top portion 794 remains stationary to help shield the device 788 from spills and precipitation that would potentially be received from above. There is a latching mechanism consisting of male member 796 and cooperating slot 798. When latch 796 is pushed in, the left side of the structure opens and may be opened completely by swinging the container 778 to the right side. The front wall 782 keeps the device 788 from falling out and the slot 786 allows insertion of a finger or thumb to touch the device 788 and push it up and out of the container 778.

FIG. 46 shows the ID badge holder 770 with the container 778 in a closed position. Stationary shelf 794 above shields the device 788 (FIG. 47) from undesired moisture. The latch release 796 on the side permits opening of the container 778.

FIG. 47 shows the container 778 in an open position. The ID badge holder 770 has the female or receiving portion 798 of the latch system on it as well as the stationary top portion 794 of the structure. If desired, this embodiment may be provided with a horizontally oriented ID badge holder and a horizontal hinge which will enable the USB flash drive holder to be in a container having the horizontal hinge at the top with the container rotatable downwardly away from the ID badge holder and being upwardly open.

Figure 48:
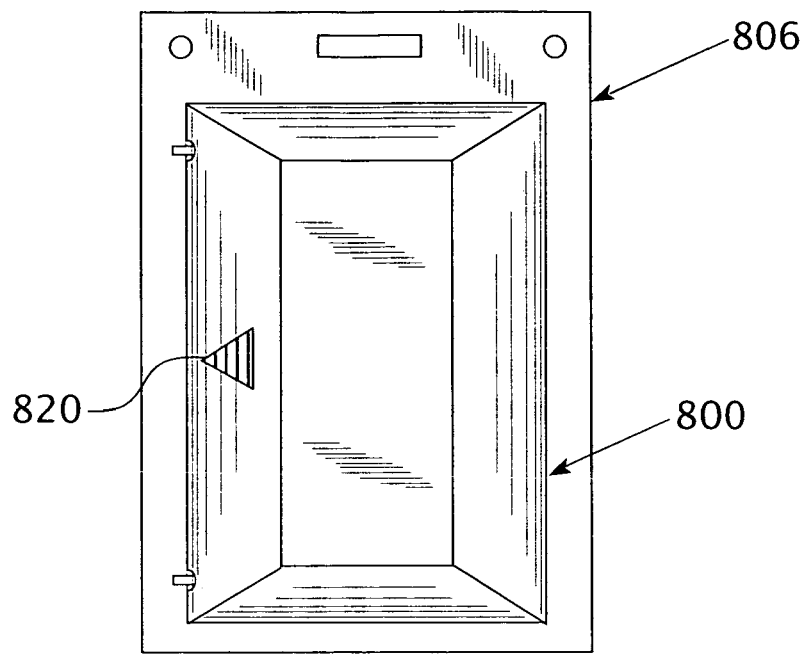
FIG. 48 is a rear elevational view of a slidable container structured to move to an open position by sliding action.
Figure 49:
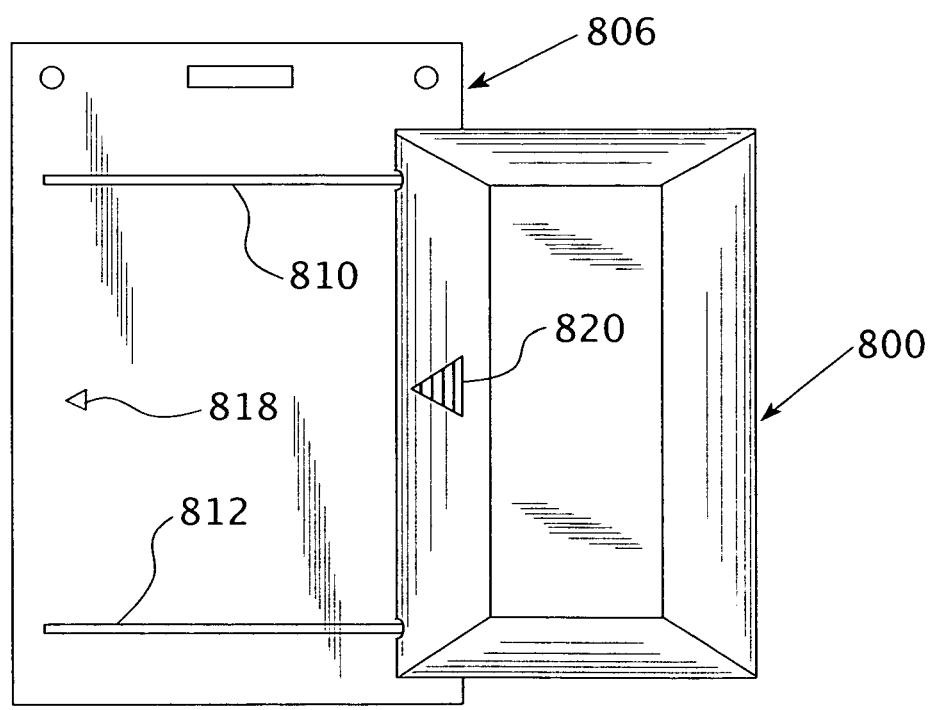
FIG. 49 shows the container of FIG. 48 moved to the open position.
Figure 50:
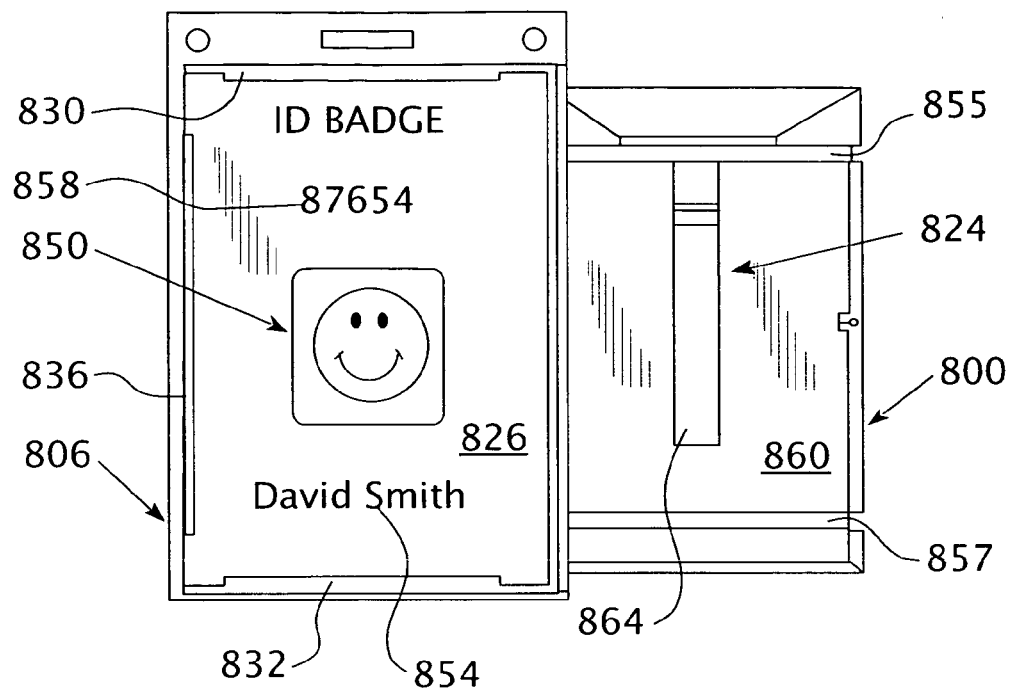
FIG. 50 shows a front elevational view of the embodiment of FIGS. 48 and 49 with the forwardly opened container in the open position and an ID badge in place.

FIGS. 48-50 show an embodiment wherein a container 800 is slidingly secured to the rear of ID badge holder 806. The container 800 moves on a pair of tracks 810, 812. It closes to the left and opens to the right by sliding on the tracks 810, 812. A latching mechanism 818, 820 on the left side secures container 800 in place when closed and releases it to open when pressed. Unlike some other embodiments of the invention, this one allows removal and insertion of the device 824 (FIG. 50) from the front side which may require less movement of the ID badge holder 806 away from the individual to access the device 824.

FIG. 48 shows the container 800 in closed position aligned with the ID badge holder 806. The latch release button 820 is located on the left side.

FIG. 49 shows the container 800 in its open position after the latch release button 820 has been pressed and the container 800 has been moved to the right. The ID badge holder 806 has generally parallel upper and lower tracks 810, 812.

FIG. 50 shows a front view of the ID badge holder 806 with the identification badge 826 held in place by the top, bottom and right sides 830, 832, 836. Logo 850, an individual's name 854 and an ID number 858 are displayed on the badge front. The container 800 has been moved out to its open position. The track recesses 855, 857 which engage rails are visible. The device 824 is held in place by the front wall 860 which has a slot 864 in it so that a finger or thumb may engage the device 824 to lift it up out of the container 800.

Figure 51:
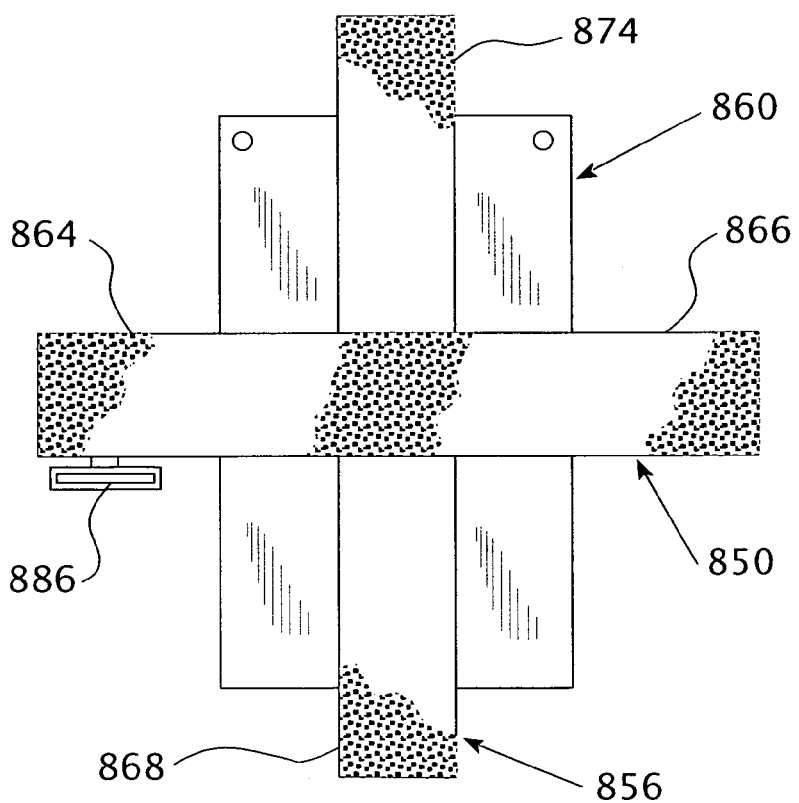
FIG. 51 shows a pair of fastener strips on two sides in the open position attached to the rear face of an ID badge holder.
Figure 52:
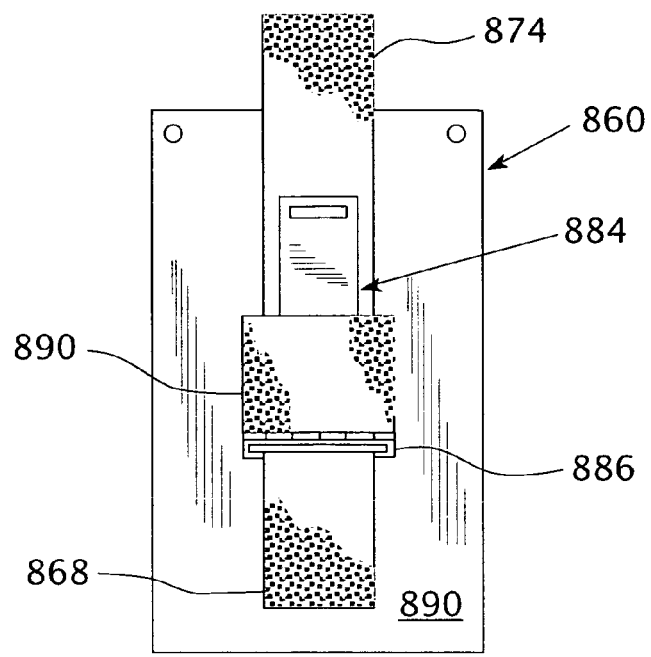
FIG. 52 shows the embodiment of FIG. 51 in the closed position, securing the USB flash drive in stored position.

The embodiment of FIGS. 51 and 52 has two long pieces of Velcro 850, 856 that are attached to the rear of the ID badge holder 860. These pieces are double sided in that one gender is on one side and the opposite gender is on the other. This type of Velcro is designed to wrap around objects and stick to itself. In this instance, the left 864 and right 866 sides, and the bottom 868 are positioned around the device 884 when a one time adjustment is made. These three sides form a pocket that is adjusted to the appropriate tension to fit tightly around the device 884. The top side 874 joins the other three sides 864, 866, 868, acting as a flap to open and close the structure for insertion and removal of device 884. Metal threading loops such as loop 886 can be employed to help snug the connections in place. The length of the Velcro straps may be trimmed, if desired.

FIG. 51 shows the structure in an open state. The ID badge holder 860 has Velcro fastener strips 850, 856 attached to it for left 864, right 866, bottom 868 and top 874 folds. A threading loop 886 hangs from the left side 864 so that the bottom 868 can loop through, adjust its length and stick to itself with its two gendered sides.

FIG. 52 shows the structure in the closed state while holding the device 884 against the rear face 890 of the ID badge holder 860. The sides have come together and formed a loop 890 to cradle the device 884. The bottom 868 has threaded through the threading loop 886 to cinch to itself once the appropriate size was determined. The top 874 may be lowered to engage against the loop 886 to close the structure.

The embodiment of FIGS. 51 and 52, while shown with a vertically oriented ID badge holder 860, may be employed either with vertically oriented or horizontally oriented ID badges.

Figure 53:
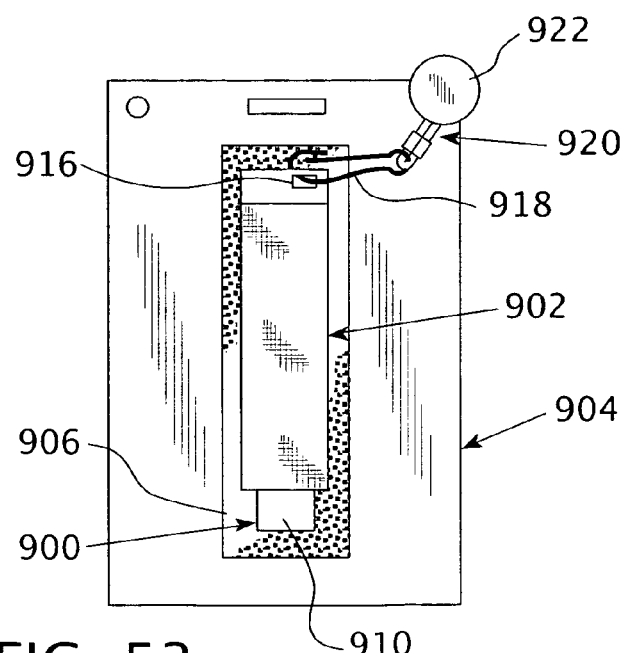
FIG. 53 is a rear elevational view showing a vertically oriented ID badge holder with two retainer structures.

FIG. 53 shows another embodiment where a jacket-type structure is utilized to connect the device 900 to the ID badge holder 904. The device 900 is inserted into the jacket 902 and the Velcro back (not shown) on the jacket joins it to the Velcro 906 on ID badge holder 904. This type of setup does not require modifying the device 900 itself by securing Velcro to it. The jacket has eyelets in it so that a tethering device 920 may still be attached and the jacket has both elastic and moisture resistant properties to make it form fitting and resistant to the elements. The jacket has a slot in the front that allows a standard-sized USB plug to fit through it, and has a section that is adjustable in the back to allow for sizing. Jacket remains on device 900 while it is in use or connected to the ID badge holder 904.

FIG. 53 shows the device 900 inside the jacket 902, while the USB connector 910 has passed through the designated slot on the bottom. The eyelet 916 allows the tethering device 920 to connect to the device 900 through an opening (not shown) jacket 902 by clip 918 and to the ID badge holder 904 by snap cap socket 922 and its associated snap post (not shown). The Velcro on the jacket joins to the mating Velcro 906, which is secured to the back of the ID badge holder 904 to hold it in place.

FIGS. 54, 54(a), 55 and 55(a) show an embodiment which is a stand-alone ID card 942 with punch-through opening 944 for an ID strap 946 secured thereto and through opening 943 to card 945 by clip 947. While most of the embodiments in this invention can be attached directly to the rear face of a stand-alone ID badge card 942, or in the preferred embodiment, a card 944 disposed rearwardly of and adjacent the ID badge 942 is employed. The stand-alone ID badge 942 that is slotted does not require an ID badge holder, but rather only an attachment device such as an ID strap clip 946 or retractable reel secured to cord 947. The rear surface of ID badge care 942 has a magnetic strip 952 for storing information. The card 945 is designed to rest adjacent to and in parallel to the ID badge 942 and be held by ID strap clip 946 through similarly cut slot 943. This card or secondary body 945 can be a hard plastic card, for example, and can be of varied dimensions.

Figure 54:
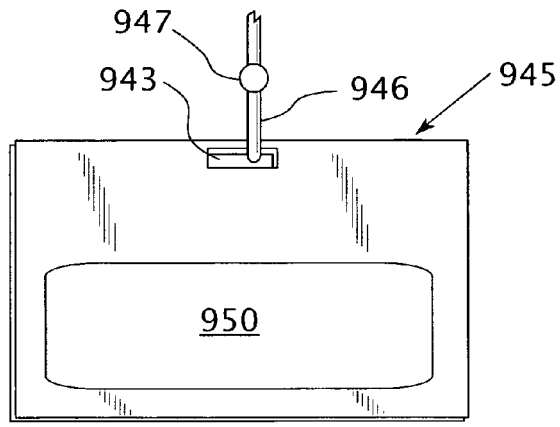
FIGS. 54 and 54(a) show, respectively, a rear elevation and right-side elevation, a freestanding ID badge in combination with another card and an attached container for receiving the USB flash drive.
Figure 54A:
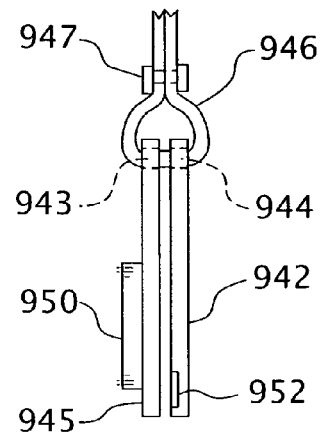

FIGS. 54 and 54(a) show the back side of a stand-alone, slot punch ID card 942, which, in the form shown, has a similar size as card 945 which holds a rearwardly projecting carrying container 950 aligned in parallel with it so that the apparatus it hooks to through the slots 944, 943 may be shared by both cards and a portable digital information device may be carried in container 950. The container 950 is drawn in a generic way as any of the embodiments described herein and may be substituted for the container 950, such as Velcro, tethers, drawers and pouches, for example. When the user needs to swipe their ID card 942 through or near a reader, the user may rotate the secondary card 944 up and out of the way to expose magnetic strip 952. When swiping the ID card 942 is completed, the secondary card 944 may be placed back in position behind ID card 942.

Figure 55:
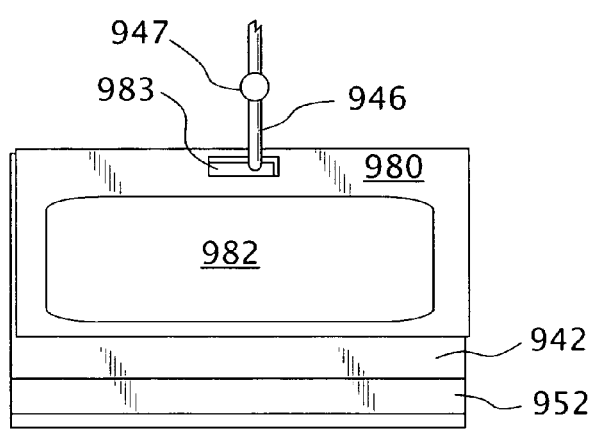
FIGS. 55 and 55(a) show, respectively, a rear elevation and right-side elevation of a structure similar to FIGS. 54 and 54(a), with the rear card having a lesser dimension so as to permit access to the magnetic stripe on the ID badge.
Figure 55A:
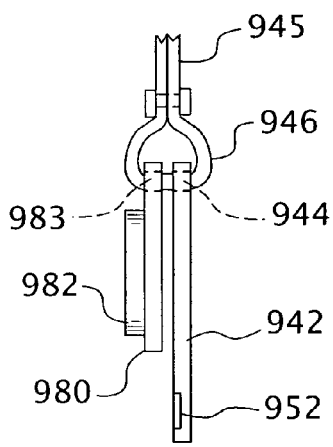

FIGS. 55 and 55(a) show an alternate configuration of the embodiment of FIGS. 54, 54(a), wherein the secondary card 980 carrying the device is shorter than the ID card 942 and has opening 983. In this configuration, the user may not have to rotate the secondary card 980 away from the ID card 942 to swipe as the magnetic track 952 is exposed. Container 982 is positioned at a higher level than container 950 of FIGS. 54 and 54(a).

Figure 56:
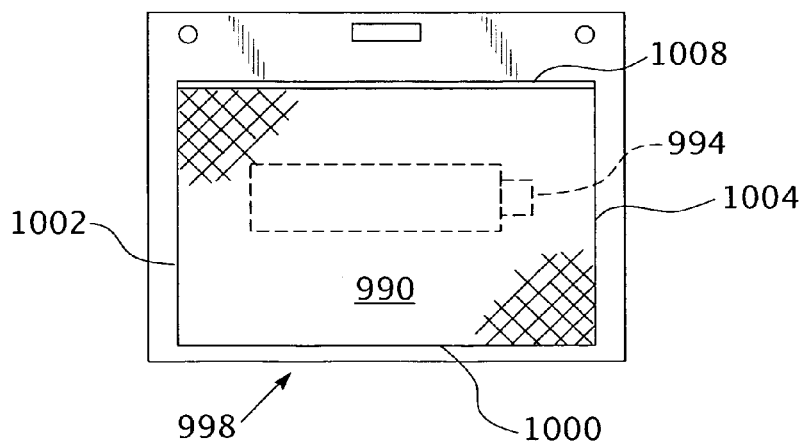
FIG. 56 shows a rear elevation of a further embodiment of the invention with a modified pouch for receiving the USB flash drive.

In the embodiment of FIG. 56, an elastic-type net pouch structure 990 is used to hold the device 994 against the rear face of ID badge holder 998. The net 990 is secured to the rear of ID badge holder 998 along the bottom 1000 and both sides 1002, 1004 with the top 1008 open. The pouch 990, which is shown only in part in the lower right corner of the figure, actually extends between the borders 1000, 1002, 1004, 1008. This construction can be applied to both vertical and horizontal orientations.

FIG. 56 shows a horizontal orientation of an ID badge holder 998 with an upwardly open net pouch 990 (shown shaded in part). The pouch 990 has a lip 1008 on top that can be moved to insert and remove the portable digital information device 994. A tethering device (not shown) could also be used in addition to pouch 990, if desired.

Figure 57:
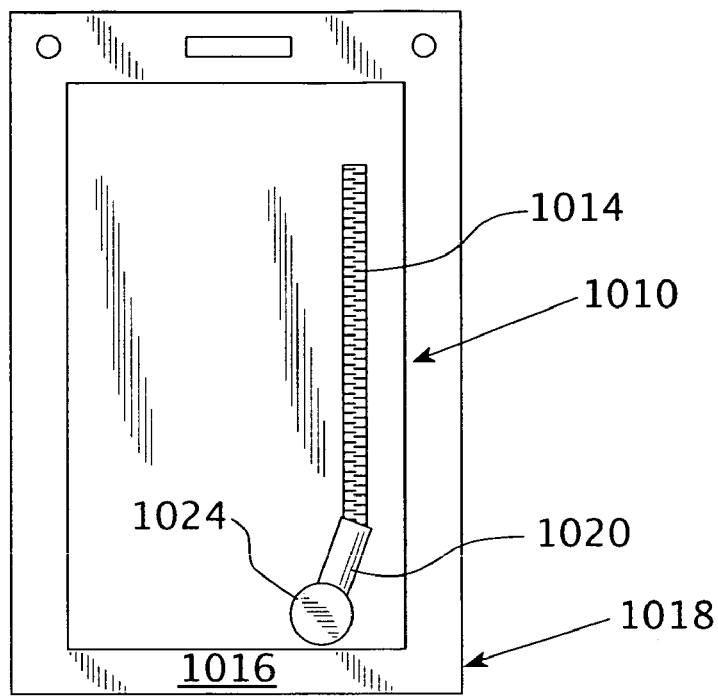
FIG. 57 shows a rear elevation of a container attached to the rear face of the ID badge holder having a zipper as a means for gaining access to the interior of the container.

The structure of FIG. 57 is a zippered pouch 1010 secured to the rear face 1016 of ID badge holder 1018. This structure can be applied to both vertical and horizontal orientations. The pouch design lends itself to warding off moisture and is secure in that a continuous, pronounced motion is required to open it. In the vertical orientation design, the zipper should be closed when it is in a downward position. In the form shown, a zipper 1014 serves to provide access to the pouch interior. The zipper pull 1020 may also be equipped with a snap cap socket 1024 that would mate to a snap cap post (not shown) while in the down position and closed to add additional security and lessen the chances of accidental opening.

Figure 58:
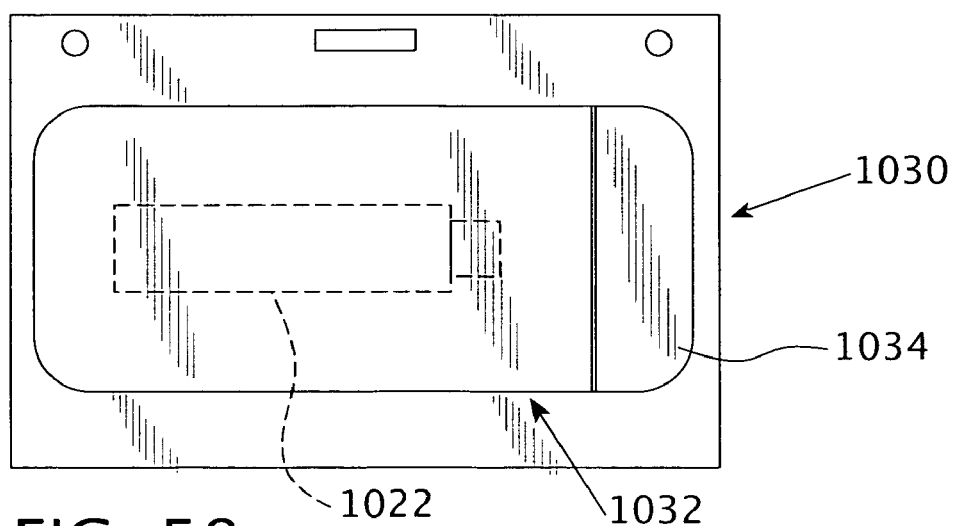
FIG. 58 is a rear elevation of another embodiment of the invention wherein a container having a hinged-end door is secured to the rear face of the ID badge holder.
Figure 59:
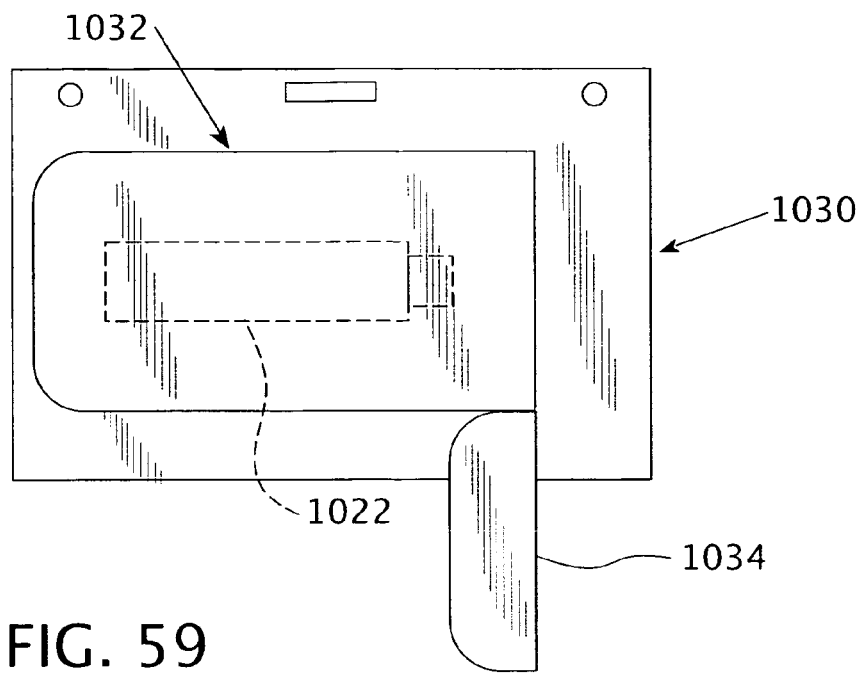
FIG. 59 is a rear elevational view of the embodiment of FIG. 58 with the rotatable door in the open position.

The embodiment of the invention shown in FIGS. 58 and 59 has the device 1022 positioned in a container 1032 somewhat like a traditional rural mailbox. The lid 1034 may be structured to either flip down on a hinge, or flip out directly away from the ID badge holder 1030. This design makes it easy to remove the device 1022. Once the door 1034 is opened, rotating the ID badge holder 1030 in a downward angle towards the direction the door opened will allow it to slide out. An end cap of device 1022 can be stored in the container 1032 while the device 1022 is in use. Transparent material can be used to allow for easy visual verification that the device 1022 is in its container 1032.

FIG. 58 shows the container 1032 oriented on a horizontally oriented ID badge holder 1030 and has the door 1034 in the closed position. The device 1022 is seen inside in dotted form.

FIG. 59 shows the container 1032 oriented on a horizontal ID badge holder 1030 and has the door 1034 in the open position. The device 1022 is seen inside in dotted form.

Figure 60:
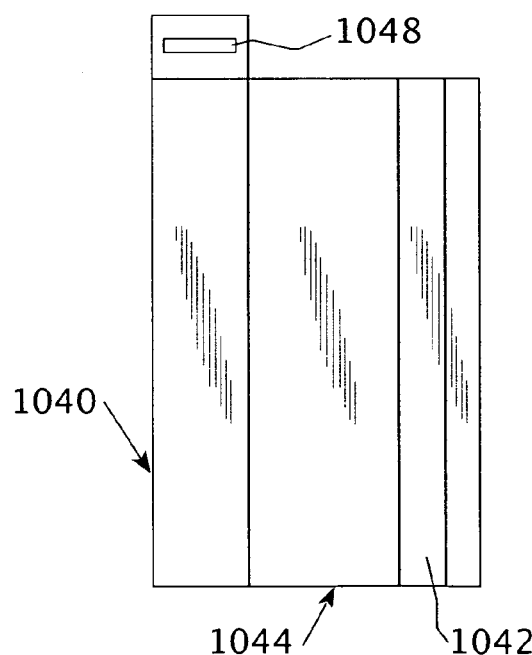
FIG. 60 shows a modified form of separate ID badge with a magnetic stripe having a reduced dimension ID badge holder secured thereto and having a loop for engagement by a cord, a clip or similar structure.
Figure 61:
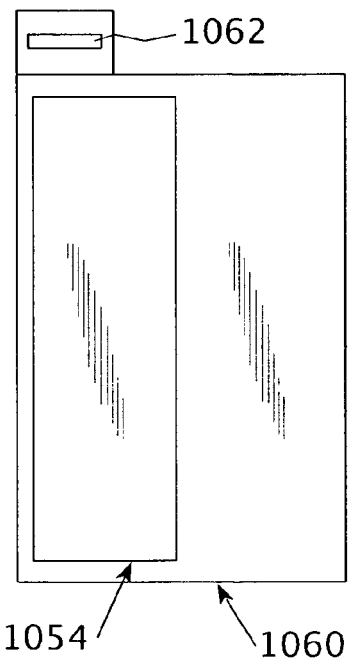
FIG. 61 is a rear elevational view showing a card disposed behind a freestanding ID badge with a container and slot for securement to a suitable cord or clip.

The embodiment of FIGS. 60 and 61 offers an alternate positioning for the various attaching and securing structures described in the other embodiments (not shown in FIG. 60). Some people prefer to carry their ID cards in a half card holder 1040 which grips one edge lengthwise and leaves maximum space for swiping the magnetic strip 1042 of card 1044 through a reader. These types of ID badge holders are generally slot-punched and have the slot 1048 directly over the side of the card that they grip and hold. If desired, a second card, such as shown in FIG. 61, could be made to lay parallel to this holder and could hold any of the containment structures described herein. To offer the best weight distribution in this embodiment, the container 1054, which holds the device, is positioned close to and beneath the slot 1062. This will help keep the ID badge 1044 oriented as intended.

FIG. 60 shows a half card holder 1040. The ID card 1044 is held on the side by the holder 1040 that has a slot 1048 on top for standard a holding apparatus, such as on an ID strap clip (not shown), or retractable reel, to connect to the card holder 1040. The magnetic stripe 1042 is shown as well.

FIG. 61 shows the secondary card 1060 to be held adjacent to and in parallel to the ID card 1044 shown in FIG. 60. Card 1060 has slot 1062 and shape to line up behind the ID badge 1044 and half holder 1040 shown in FIG. 60 with slots 1048, 1062 aligned. The device holder 1054 is shown generically as virtually any of the embodiments described herein may be employed.

Figure 62:
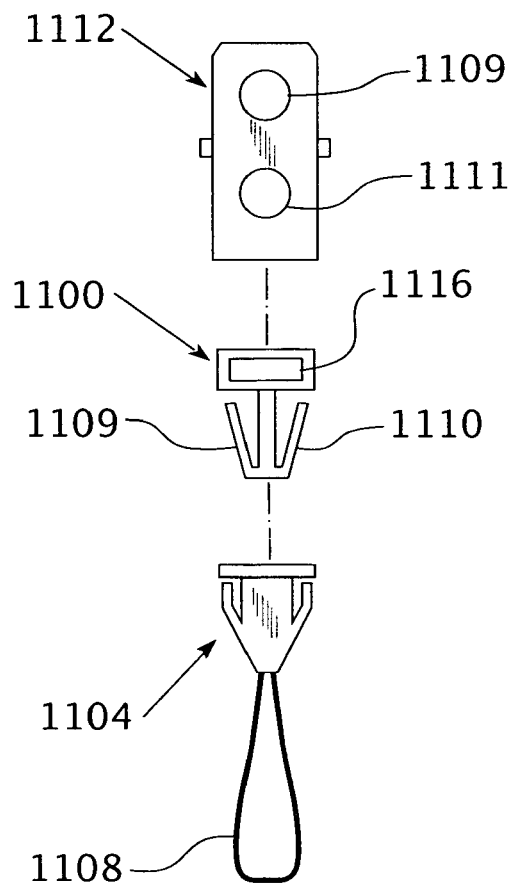
FIGS. 62-64 show modified forms of ID badges, USB flash drive and securement structures employing alligator clips.
Figure 63:
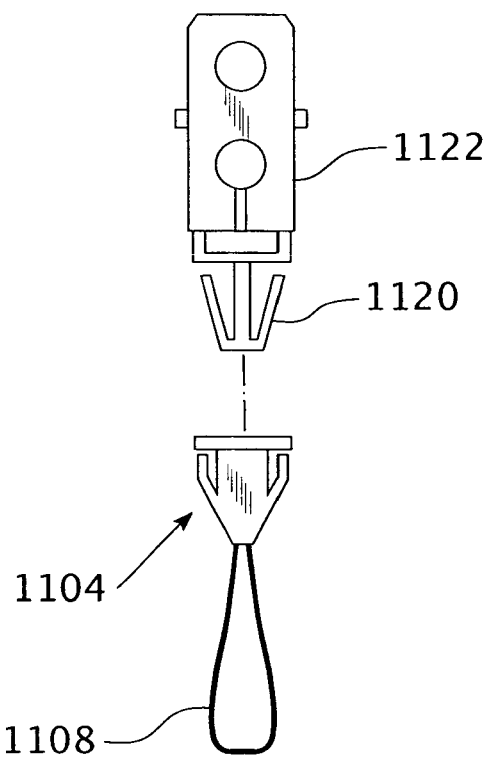
Figure 64:
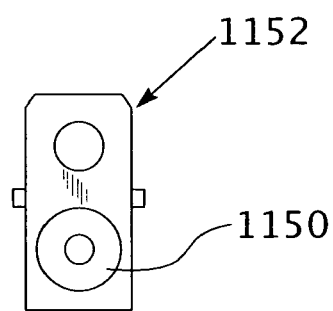

The embodiment of FIGS. 62-64 shows alternative structures for creating tethering devices. FIGS. 1 through 5 show lanyard hooks or thread loops for connecting to portable digital information access/storage devices on one end, and snaps on the other end can be used to join them to various places to help secure the devices. Many USB flash drives are shipped with a standardized lanyard and detachable clip mechanism that can be modified to suit the purpose of tethering the device to an ID strap clip.

FIG. 62 is an exploded view which shows a lanyard side clip portion 1100 of an industry standard USB flash drive clip and the other half of the clip 1104 that clip portion 1100 mates with and the loop 1108 that extends from it and attaches the USB flash device (not shown). Also shown is a front view of the metal part 1112 of the alligator clip which can be attached to one's clothing or a lanyard, such as by means of a snap loop which passes through an opening 1109, 1111. With respect to clip 1100, the lanyard has been cut off and no longer occupies the square loop 1116 shown at the top. The ID badge holder (not shown) may be secured through loop 1116. Fingers 1109, 1110 are resilient and flex to engage and lock clip portion 1104 to clip portion 1100.

FIG. 63 shows an alternate configuration of these industry standard parts. The first portion of the industry standard clip 1120 that was removed from its lanyard, has been partially inserted into the ID strap clip 1122 section and fastened to it by way of a small wire tie through the loop in clip 1120 and the standard clip in part 1122. Section 1104 can now mate with the ID strap clip 1122 and the loop 1108 can still connect USB flash drive. The result is a tethering device that extends from the ID strap clip 1112. This is also an additional level of security as with other tethering device examples disclosed herein, the device was held on the ID badge holder and also tethered to it. With this method, it is held to one structure (ID badge holder), and tethered to it parent structure, the ID strap clip 1122. Even if the ID badge holder comes loose from the lanyard, the device is still tethered to it.

The base of the ID strap clip itself has pre-existing holes where a snap stud and snap post may be joined through and offer an additional location to connect a tethering device to.

FIG. 64 shows a snap post 1150 that has been attached to the ID strap clip 1152 by way of a snap cap socket (not shown). A snap cap socket of a tether could be secured to the clip 1152.

Figure 65:
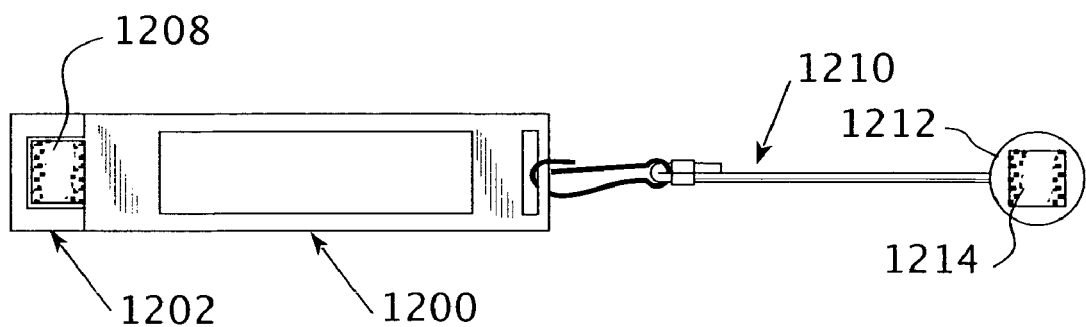
FIGS. 65 and 66 show an embodiment of the invention which provides an alternate USB flash drive storage structure.
Figure 66:
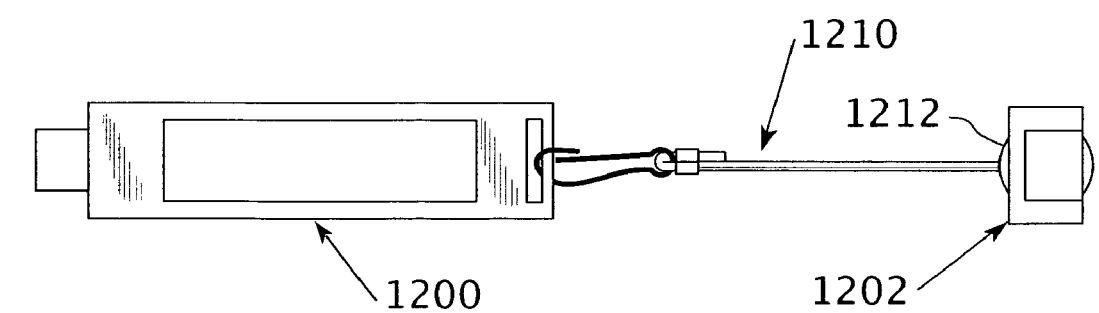

FIGS. 65 and 66 show a USB flash drive 1200 having an end cap 1202 provided with Velcro 1208 of first gender secured thereto and tether 1210 having a snap cap socket 1212 to which has secured to it Velcro 1214 of a second gender. When cap 1202 is removed from the USB flash drive, it can be stored on the snap cap socket by interengaging the Velcro pieces 1208, 1214.

Figure 67:
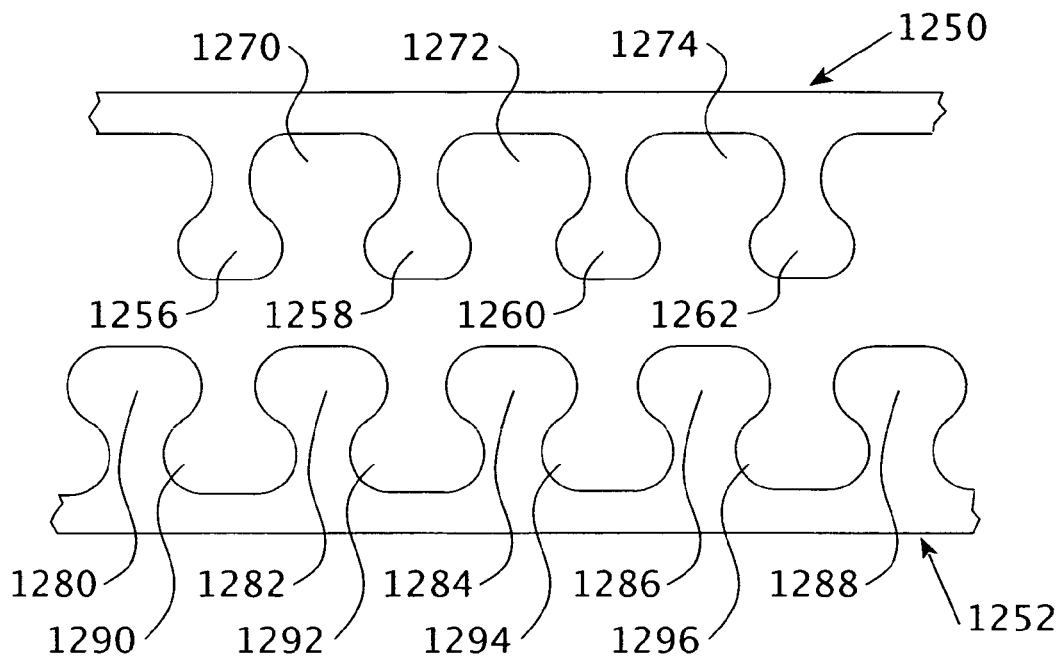
FIG. 67 is an exploded schematic view of portions of a pair of fastener strips which in the form shown are projection fasteners having generally mushroom-shaped projections shown in the open position.
Figure 68:
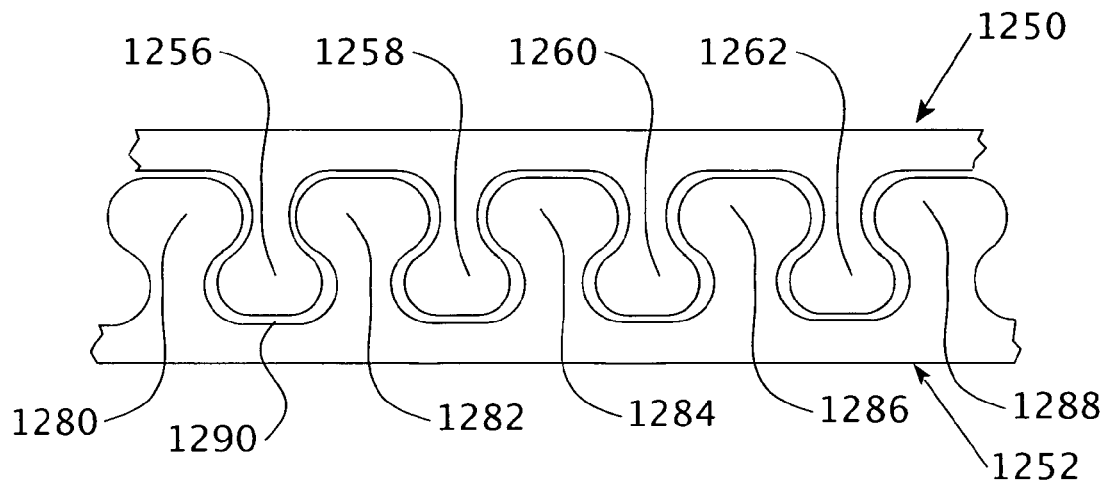
FIG. 68 is a schematic view of the strips of FIG. 67 interengaged in locked position.

Referring to FIGS. 67 and 68 in the form shown, there is shown a pair of fastener strips which in the form shown are of the projection fastener-type having generally mushroom-shaped projections. The strips 1250, 1252, respectively, have resilient projections 1256, 1258, 1260, 1262 and 1280, 1282, 1284, 1286 and 1288 in the strip 1250, 1252. Recesses 1270, 1272, 1274 are structured to receive projections 1282, 1284 and 1286, respectively. Similarly, recesses 1290, 1292, 1294 and 1296 are structured to receive projections 1256, 1258, 1260 and 1262, respectively. The strips 1250, 1252 may be locked as shown in FIG. 67 by applying a force to achieve relative closing movement and may be separated by pulling them apart.

As unlike the hook-and-loop embodiments, the strips are not gender-specific; they provide additional flexibility of design. The portable digital information device can be secured to the badge holder by means of these strips. Also, a piece of this type of fastener strip may be secured to the USB flash drive cap and, if desired, when the cap is removed, it may be secured to a similar piece of fastener strip on the USB flash drive rather than to a similar fastener strip on the identification badge holder or identification badge.

While the invention is not limited to specific dimensions or materials, the ID badges, ID badge holders and other information articles will generally be made of a rigid resinous plastic or metal material. They may have a length of up to 4¼ inches, a width of up to about 3 inches and a thickness of up to about 3/16 inch. The USB flash drive, for example, may have a length of up to about 3 inches, a width of up to about ¼ inch and thickness of about 0.35 inch. This will result in the USB flash drive being visually shielded by the information articles to which they are secured.

While for convenience of disclosure herein reference has been made in some instances to the use of fastener strips which are hook-and-loop fasteners, other protection fasteners as defined herein may be employed in lieu of the hook-and-loop species.

While for convenience of reference herein, words of general orientation such as "vertical" or "horizontal" have been employed, they are not limiting of the invention unless expressively indicated to the contrary in a specific recital.

Whereas particular embodiments of the invention have been described herein for purposes of illustration, it will be evident to those skilled in the art that numerous variations of the details may be made without departing from the invention as defined in the appended claims.

The invention claimed is:

1. An identification badge holder assembly comprising
an identification badge holder having a front face for receiving and displaying information and a rear face,
a portable digital information device removably and returnably secured to said rear face,
said portable digital information device secured to said rear face by a tether, and
said tether secured to said rear face by a snap cap assembly having one component secured to said rear face and a co-acting second component secured to said tether.

2. The identification badge holder assembly of claim 1 including
said tether having a connector secured to said portable digital information device.

3. The identification badge holder assembly of claim 2 including
said connector being selected from the group consisting of alligator clips and closed loops.

4. The identification badge holder assembly of claim 3 including
said tether having an elongated cord-like line,
said tether having said snap cap assembly at one end of said cord-like line, and
said connector disposed at the other end of said cord-like line.

5. The identification badge holder assembly of claim 4 including
said identification badge holder being structured to be worn in a generally horizontal orientation.

6. The identification badge holder assembly of claim 5 including
said snap cap assembly being secured to said rear face above said portable digital information device.

7. The identification badge holder assembly of claim 4 including
said identification badge holder being structured to be worn in a generally vertical orientation.

8. The identification badge holder assembly of claim 7 including
said snap cap assembly being secured to said rear face adjacent to said portable digital information device.

9. An identification badge holder assembly comprising
an identification badge holder having a front face for receiving and displaying information and a rear face,
a portable digital information device removably and returnably secured to said rear face,
said portable digital information device secured to said rear face by a tether, and
an elastic material defining a passageway for securing said portable digital information device to said identification badge holder.

10. The identification badge holder assembly of claim 9 comprising
an identification badge holder,
a first portion of a first fastener for securing a portable digital information device secured to said identification badge holder, and
a first portion of a second fastener for securing a portable digital information device secured to said identification badge holder.

11. The identification badge holder assembly of claim 10 including
said second fastener being a snap cap assembly.

12. An identification badge holder assembly comprising
an identification badge holder having a front face for receiving and displaying information and a rear face,
a portable digital information device removably and returnably secured to said rear face,
said portable digital information device secured to said rear face by a tether, and
an elastic material secured to said rear face and defining a passageway, and
said portable digital information device disposed within said passageway.

13. The identification badge holder assembly of claim 12 including
said portable digital information device secured to said rear face by a tether.

14. The identification badge holder assembly of claim 13 including
the tether having an elongated, cord-like line, and
said tether having a snap cap assembly at one end of said cord-like line and
being secured to said portable digital information device at the other end.

15. The identification badge holder assembly of claim 14 including
the snap cap assembly being secured to said rear face above said portable digital information device.

16. The identification badge holder assembly of claim 15 including
said ID badge holder being structured to be worn in a generally horizontal orientation.

17. The identification badge holder assembly of claim 12 including
said ID badge holder being structured to be worn in a generally vertical orientation.

18. An identification badge holder assembly comprising
an identification badge holder having a front face for receiving and displaying information and a rear face,
an elastic material secured to said rear face and defining a passageway therebetween,
said passageway being structured to receive and secure a portable digital information device,
a first portion of a first fastener secured to said rear face,
said first fastener being a snap cap assembly, and
said assembly having (a) a tether with a second portion of said first fastener and (b) a fastener securable to a USB flash drive.

* * * * *

UNITED STATES PATENT AND TRADEMARK OFFICE
CERTIFICATE OF CORRECTION

PATENT NO. : 7,774,969 B1  Page 1 of 2
APPLICATION NO. : 11/603493
DATED : August 17, 2010
INVENTOR(S) : Lee O. Silverman It is certified that error appears in the above-identified patent and that said Letters Patent is hereby corrected as shown below:

On the Title page item [56]: Column 2, U.S. PATENT DOCUMENTS, "2002/0153400 A1 10/2002 Chase et al." should read --1002/0153400 A1 10/2002 Chase et al.........224/610--.
Column 2, line 38, "ones person" should read --one's person--.
Column 7, line 66, "device or" should read --device" or--.
Column 9, line 58, "badge holder" should read --a badge holder--.
Column 10, line 26, "carried in" should read --carried in a--.
Column 10, line 39, "to ID badge" should read --to an ID badge--.
Column 10, line 48, having socket" should read --having a socket--.
Column 10, line 48, "to post" should read --to the post--.
Column 10, line 49, "to ID badge" should read --to the ID badge--.
Column 10, line 58, "ones person" should read --one's person--.
Column 11, line 26, "on rear" should read --on the rear--.
Column 11, line 36, "horizontal ID badge" should read --a horizontal ID badge--.
Column 11, line 38, "to back of ID badge" should read --to the back of the ID badge--.
Column 11, line 49, "to two" should read --the two--.
Column 11, line 65, "i.e. it is secured" should read --i.e., it is secured--.
Column 12, line 3, "of badge holder" should read --of the badge holder--
Column 12, line 14, "the cards functionality" should read --the card's functionality--.
Column 12, line 42, "device shown 60" should read --device 60--.
Column 12, line 62, "then insert it" should read --then inserting it--.
Column 12, line 67, "may be then be" should read --may then be--.
Column 14, line 37, "device 136 returned" should read --device 136 is returned--.
Column 14, line 51, "Identification badge" should read --identification badge--.
Column 16, line 1, "ones person" should read --one's person--.
Column 17, line 24, "can forgo" should read --can forego--.
Column 19, line 6, "on drawer" should read --on the drawer--.
Column 19, line 16, "retains device" should read --retains a device--.
Column 21, line 53, "Jacket" should read --The jacket--.
Column 21, line 54, "on device" should read --on the device--.
Column 22, line 8, "badge care" should read --badge card--.
Column 23, line 32, "standard a holding apparatus" should read --a standard holding apparatus--.

Signed and Sealed this

Seventh Day of December, 2010

David J. Kappos
*Director of the United States Patent and Trademark Office*

CERTIFICATE OF CORRECTION (continued)
U.S. Pat. No. 7,774,969 B1

Column 24, line 1, "connect" should read --connect with the--.
Column 24, line 50, "1/4 inch" should read --3/4 inch--.
Column 24, line 62, "expressively indicated" should read --expressly indicated--.